United States Patent
Yuan et al.

(10) Patent No.: US 9,336,891 B2
(45) Date of Patent: May 10, 2016

(54) LOOK AHEAD READ METHOD FOR NON-VOLATILE MEMORY

(71) Applicant: SanDisk Technologies Inc., Plano, TX (US)

(72) Inventors: Jiahui Yuan, Fremont, CA (US); Yingda Dong, San Jose, CA (US); Wei Zhao, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/322,055

(22) Filed: Jul. 2, 2014

(65) Prior Publication Data
US 2016/0005491 A1 Jan. 7, 2016

(51) Int. Cl.
G11C 16/34 (2006.01)
G11C 16/26 (2006.01)
G11C 11/56 (2006.01)
H01L 27/115 (2006.01)

(52) U.S. Cl.
CPC ............ *G11C 16/34* (2013.01); *G11C 11/5642* (2013.01); *G11C 16/26* (2013.01); *G11C 16/3427* (2013.01); *G11C 2211/5648* (2013.01); *H01L 27/1157* (2013.01); *H01L 27/11582* (2013.01)

(58) Field of Classification Search
CPC ........... G11C 11/5628; G11C 16/3427; G11C 11/5642; G11C 16/26; G11C 16/34; G11C 2211/5648; H01L 27/1157; H01L 27/11582
See application file for complete search history.

(56) References Cited

U.S. PATENT DOCUMENTS

| | | | |
|---|---|---|---|
| 7,499,319 B2 | 3/2009 | Mokhlesi | |
| 7,606,084 B2 | 10/2009 | Kamei | |
| 7,898,864 B2 | 3/2011 | Dong | |
| 8,051,240 B2 | 11/2011 | Dutta et al. | |
| 8,400,839 B2 | 3/2013 | Li | |
| 8,411,507 B2 | 4/2013 | Li | |
| 8,456,911 B2 | 6/2013 | Yuan et al. | |

(Continued)

FOREIGN PATENT DOCUMENTS

| | | |
|---|---|---|
| EP | 2100307 A2 | 9/2009 |
| WO | WO2007/143399 A2 | 12/2007 |
| WO | WO2008/083132 A2 | 7/2008 |

OTHER PUBLICATIONS

International Search Report & The Written Opinion of the International Searching Authority dated Oct. 14, 2015, International Application No. PCT/US2015/037805.

*Primary Examiner* — Richard Elms
*Assistant Examiner* — Ajay Ojha
(74) *Attorney, Agent, or Firm* — Vierra Magen Marcus LLP

(57) ABSTRACT

A read operation for selected memory cell on a selected word line compensates for program disturb which is a nonlinear function of the data state of an adjacent memory cell on an adjacent word line. When a command to perform a read operation for the selected memory cell is received, a read operation is first performed on the adjacent memory cell to determine its data state, or to classify the adjacent memory cell into a threshold voltage range which includes one or more data states, or a portion of a data state. The selected memory cell is then read using a baseline control gate voltage which does not provide compensation, and one or more elevated control gate voltages which provide compensation, to distinguish between two adjacent data states. An optimal sensing result is selected based on the data state or threshold voltage range of the adjacent memory cell.

17 Claims, 24 Drawing Sheets

(56) References Cited

U.S. PATENT DOCUMENTS

| | | |
|---|---|---|
| 2006/0221692 A1 | 10/2006 | Chen |
| 2008/0019193 A1 | 1/2008 | Li et al. |
| 2010/0149868 A1* | 6/2010 | Yoo et al. ............... 365/185.03 |
| 2010/0232221 A1* | 9/2010 | Park et al. ............... 365/185.03 |
| 2010/0265764 A1* | 10/2010 | Yoo et al. ............... 365/185.02 |
| 2012/0243326 A1* | 9/2012 | Maeda ............... 365/185.21 |
| 2013/0155776 A1* | 6/2013 | Chilappagari et al. ... 365/185.24 |
| 2013/0201760 A1 | 8/2013 | Dong et al. |
| 2013/0326314 A1 | 12/2013 | Choi et al. |
| 2014/0043915 A1 | 2/2014 | Choi |

* cited by examiner

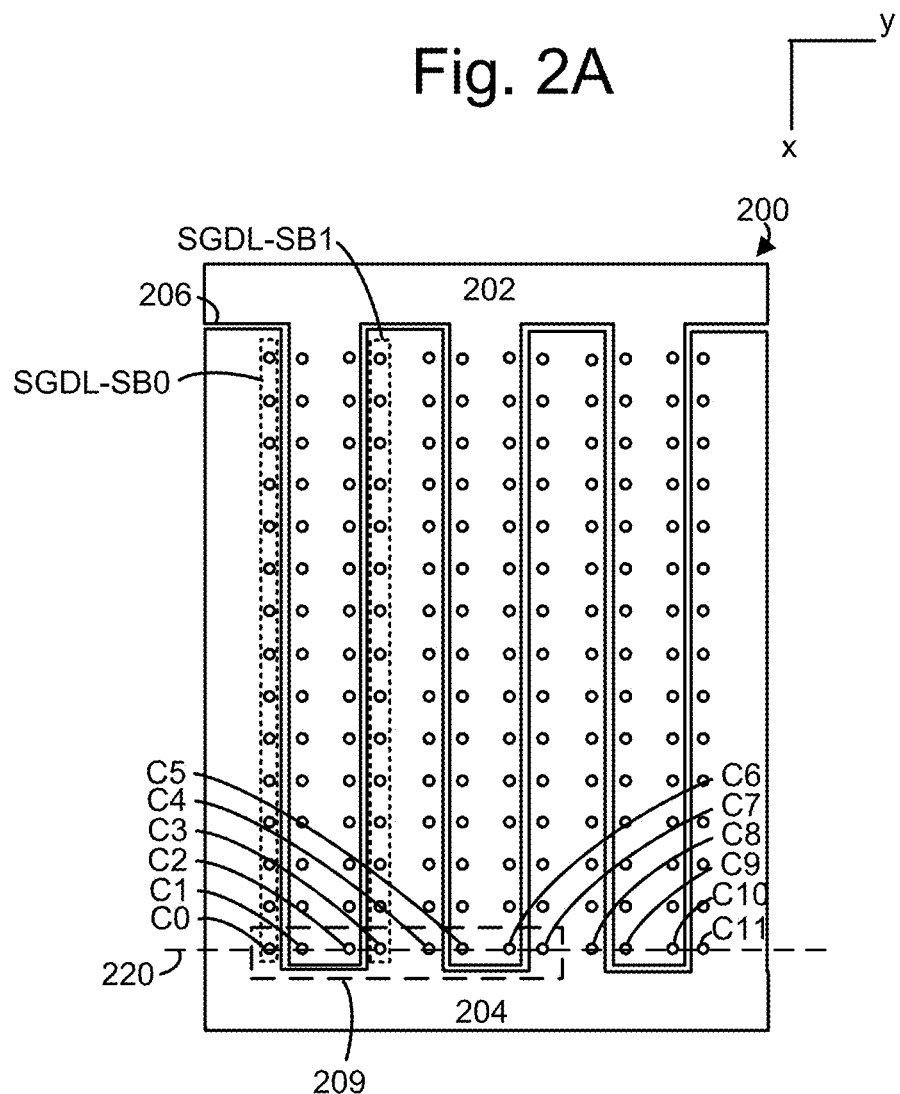

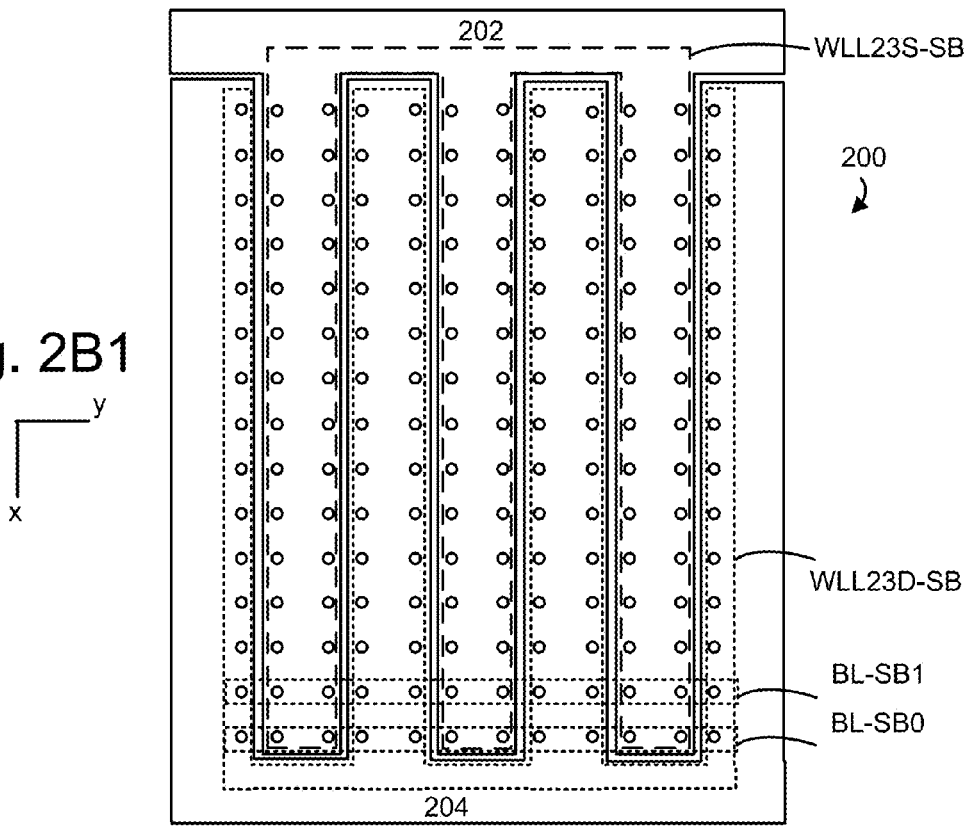
Fig. 2B1
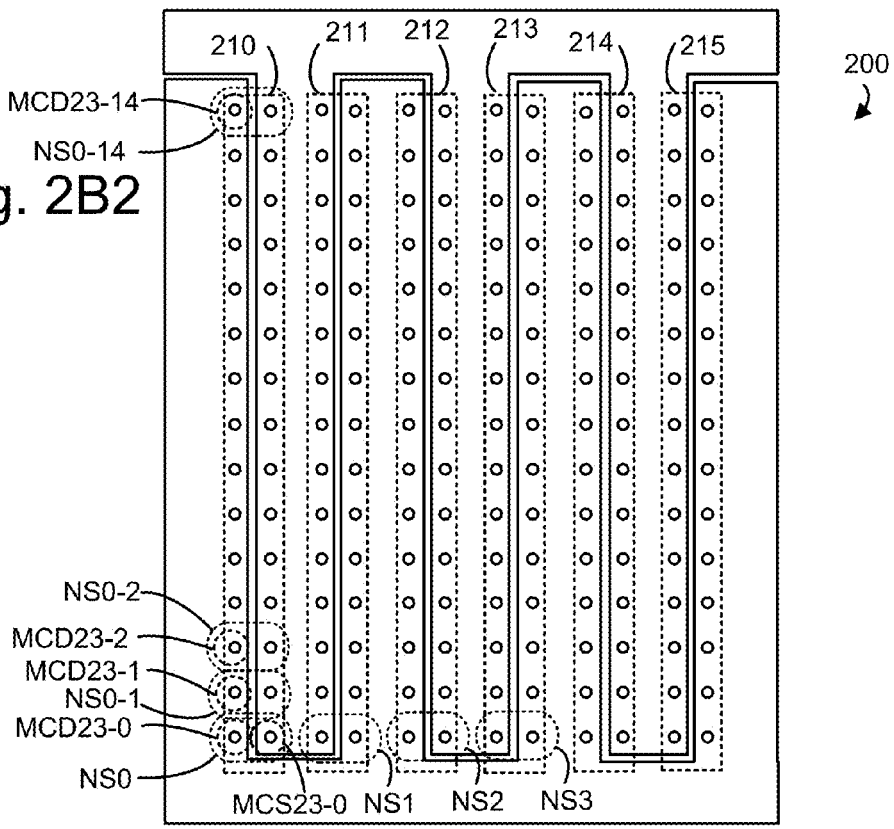
Fig. 2B2

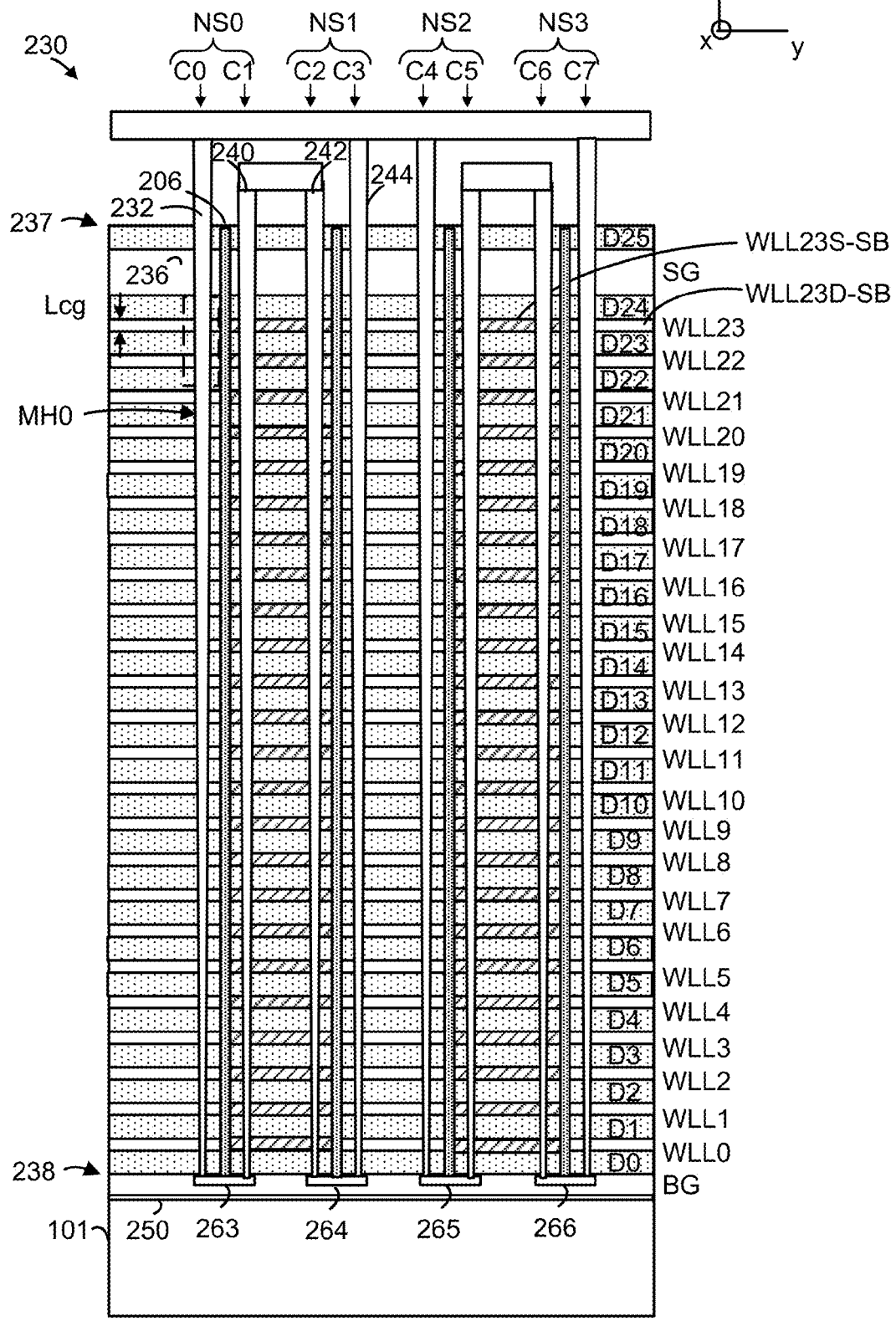

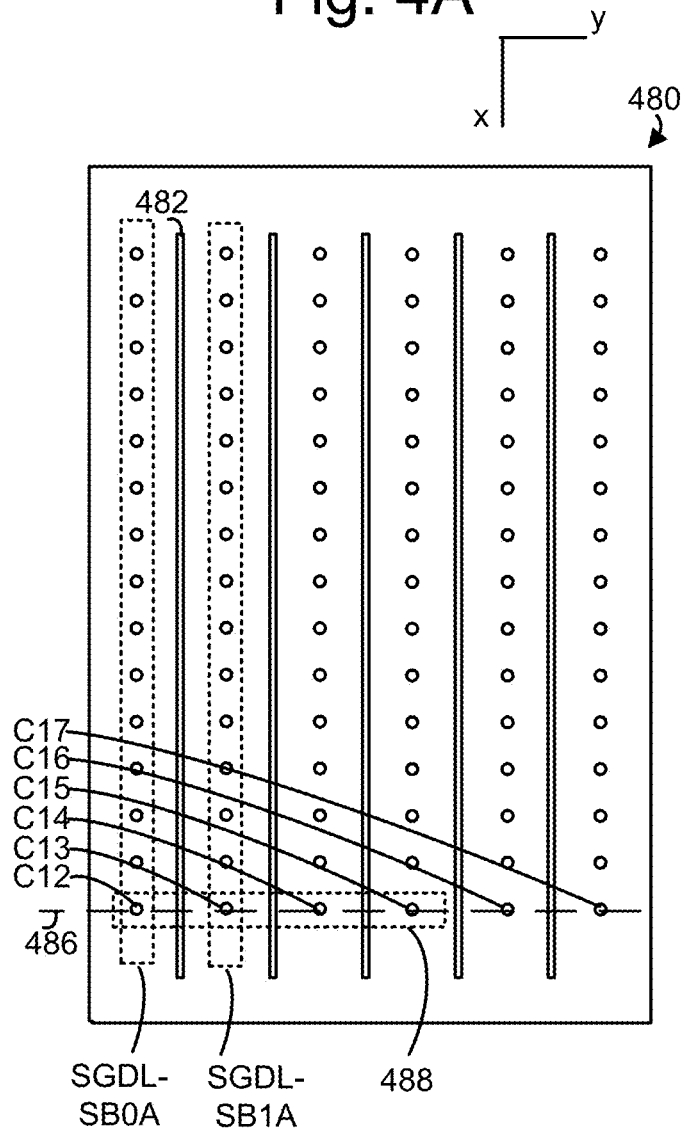

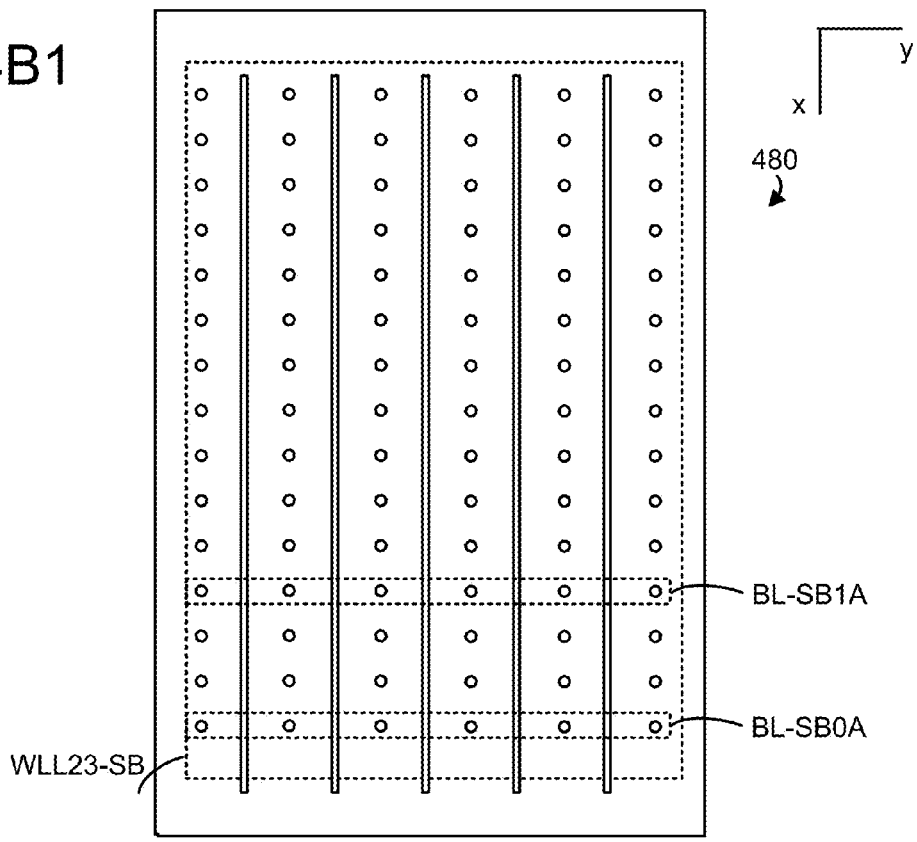
Fig. 4B1
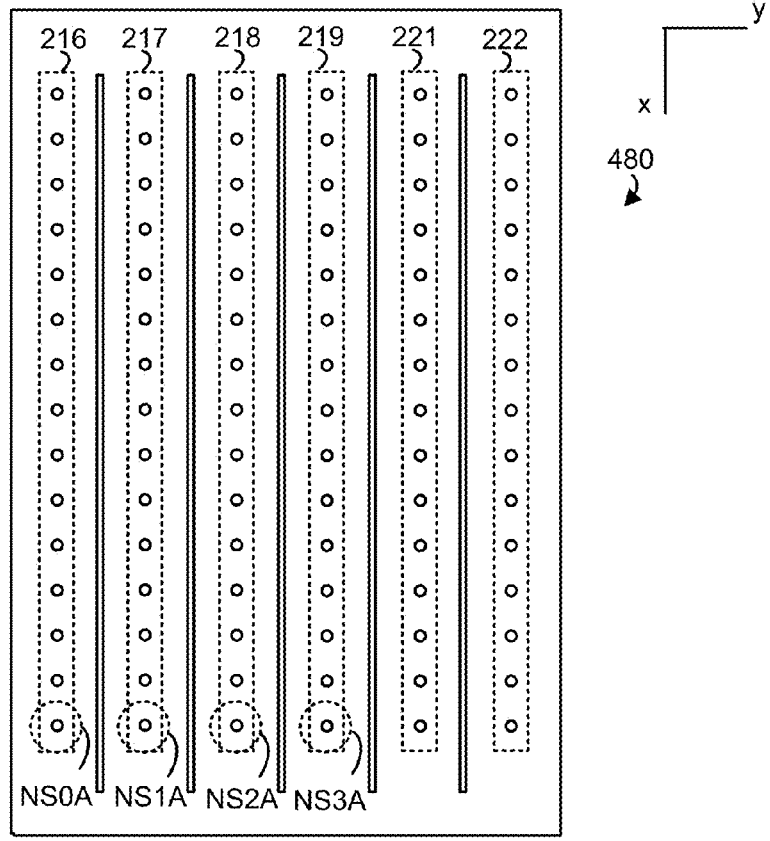
Fig. 4B2

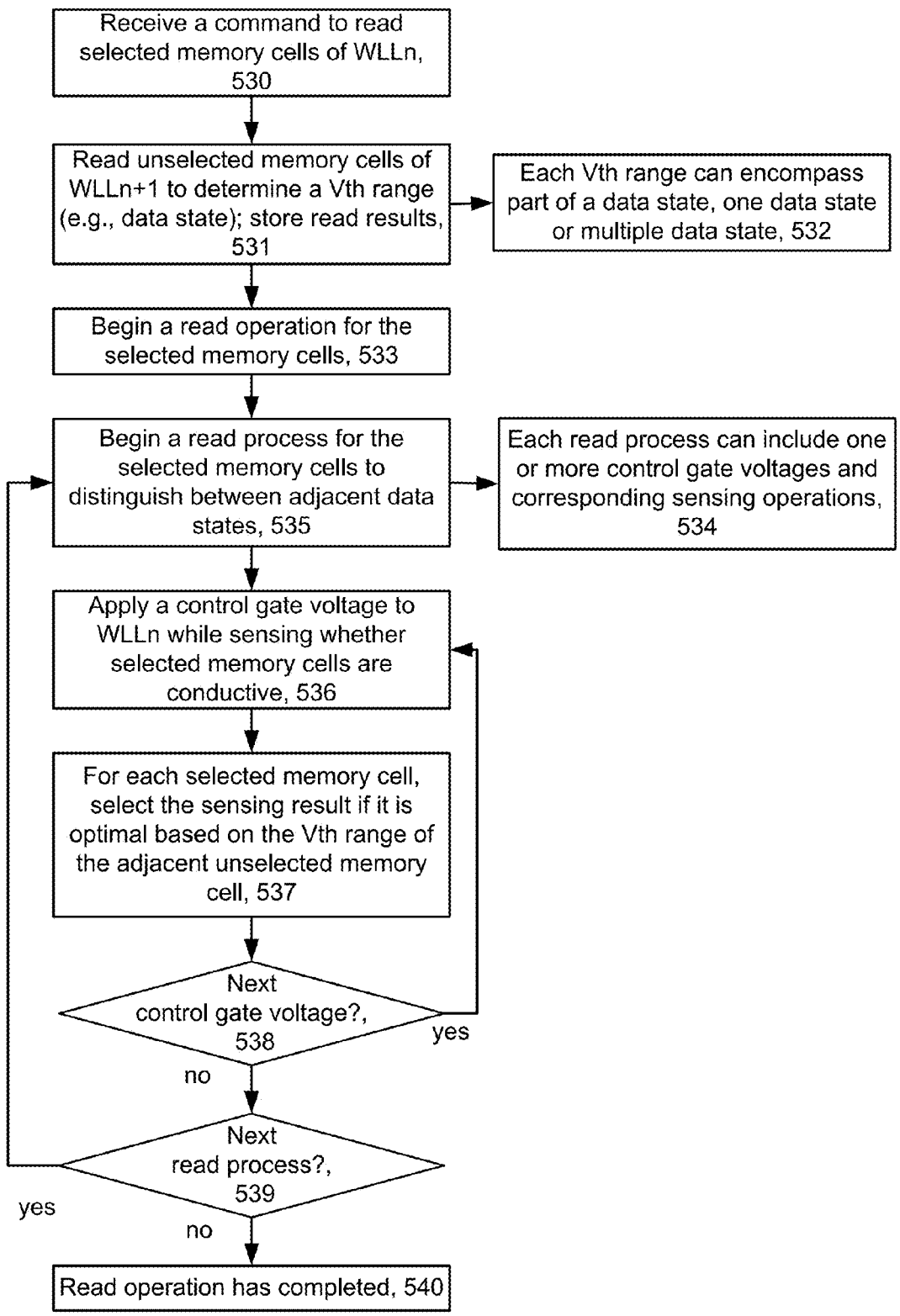

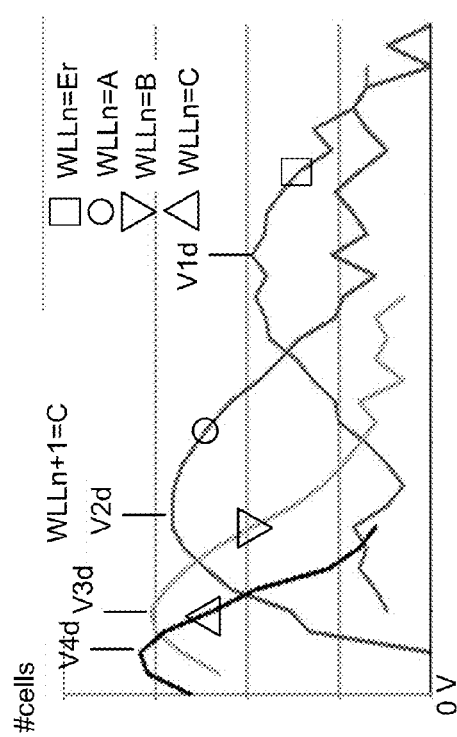
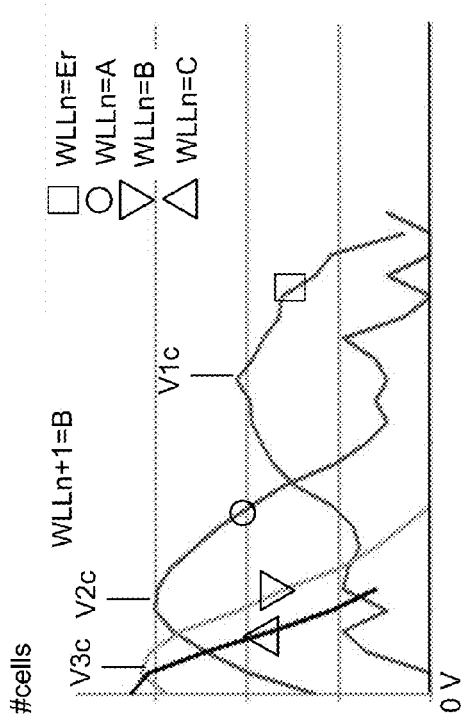
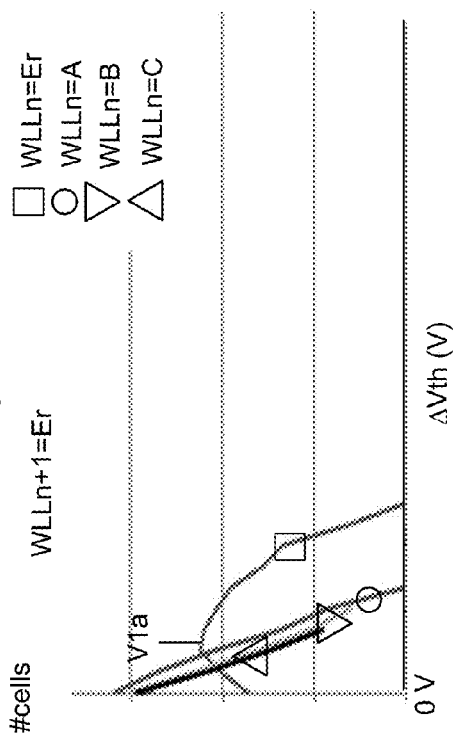

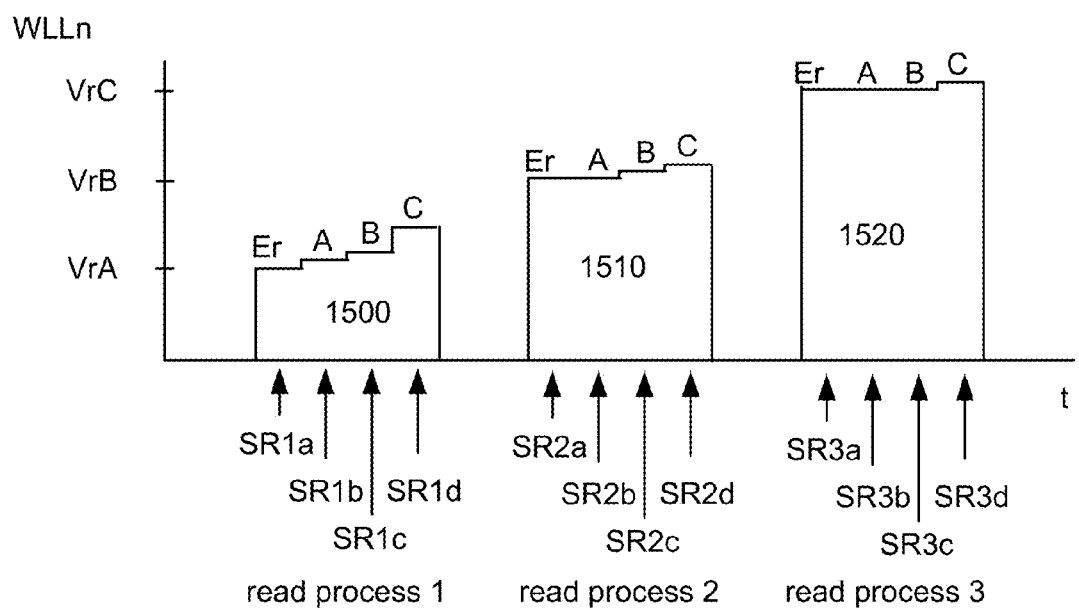

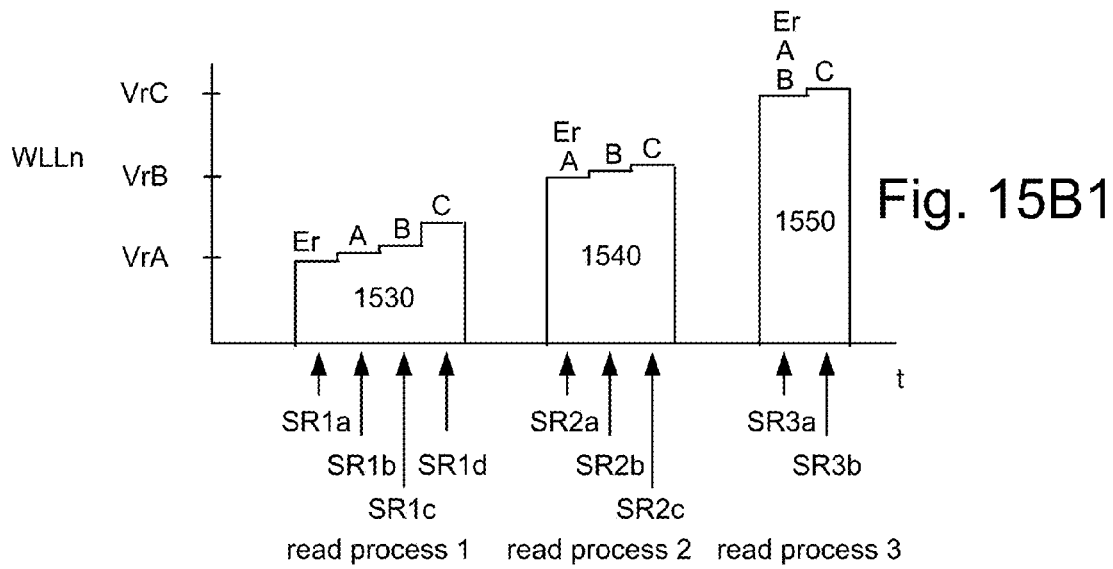
Fig. 15B1
Fig. 15B2
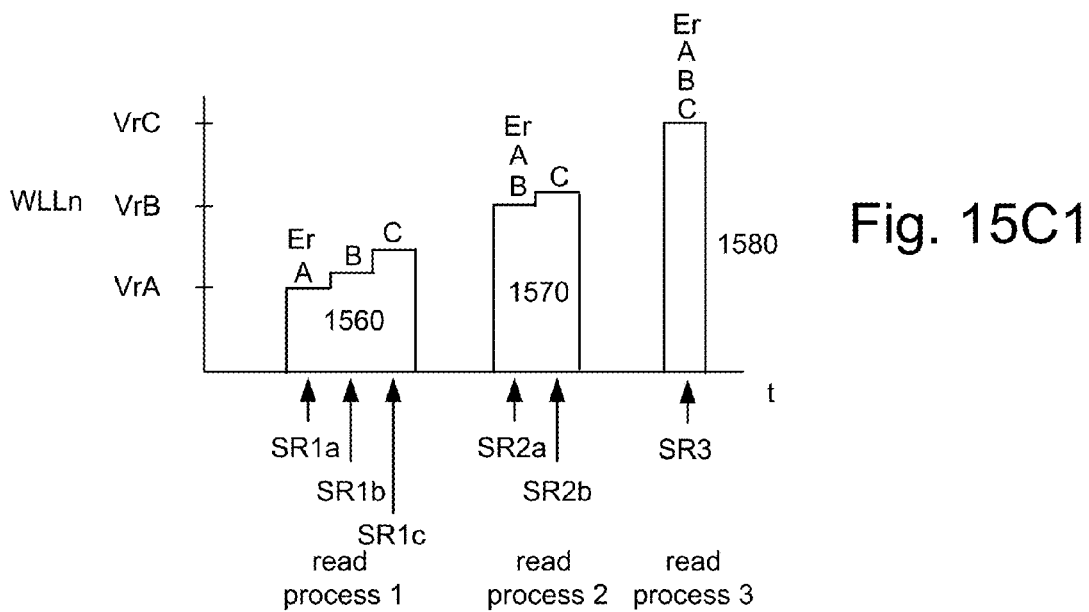
Fig. 15C2
Fig. 15C1

LOOK AHEAD READ METHOD FOR NON-VOLATILE MEMORY

BACKGROUND

The present technology relates to techniques for reading memory cells in a non-volatile memory device.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Flash memory is among the most popular type of non-volatile semiconductor memories. With flash memory, the contents of an entire memory array can be erased in one step.

For example, two-dimensional NAND memory is one type of flash memory in which a floating gate is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Moreover, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with materials including a charge trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 2C depicts an embodiment of a stack 230 showing a cross-sectional view of the portion 209 of the block 200 of FIG. 2A, along line 220.

FIG. 4A depicts a top view of a straight NAND string embodiment (block 480) of the block BLK0 of FIG. 1A, showing example SGD line subsets SGDL-SB0A and SGDL-SB1A.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 5C depicts an example of a reading operation consistent with step 502 of FIG. 5A.

FIG. 11A depicts an alternative view of the data of FIG. 10A, where a shift in Vth due to program disturb is depicted on the horizontal axis and a number of memory cells is depicted on the vertical axis.

FIG. 11B depicts an alternative view of the data of FIG. 10B, where a shift in Vth due to program disturb is depicted on the horizontal axis and a number of memory cells is depicted on the vertical axis.

FIG. 11C depicts an alternative view of the data of FIG. 10C, where a shift in Vth due to program disturb is depicted on the horizontal axis and a number of memory cells is depicted on the vertical axis.

FIG. 11D depicts an alternative view of the data of FIG. 10D, where a shift in Vth due to program disturb is depicted on the horizontal axis and a number of memory cells is depicted on the vertical axis.

FIG. 15A1 depicts control gate voltages applied to a selected word line, as an example of step 536 of FIG. 5C.

FIG. 15A2 depicts a table of adjustments to a control gate voltage in a read operation, consistent with FIG. 15A1.

FIG. 15B1 depicts control gate voltages applied to a selected word line, as an example of step 536 of FIG. 5C.

FIG. 15B2 depicts a table of adjustments to a control gate voltage in a read operation, consistent with FIG. 15B1.

FIG. 15C1 depicts control gate voltages applied to a selected word line, as an example of step 536 of FIG. 5C.

FIG. 15C2 depicts a table of adjustments to a control gate voltage in a read operation, consistent with FIG. 15C1.

DETAILED DESCRIPTION

Figure 1A:
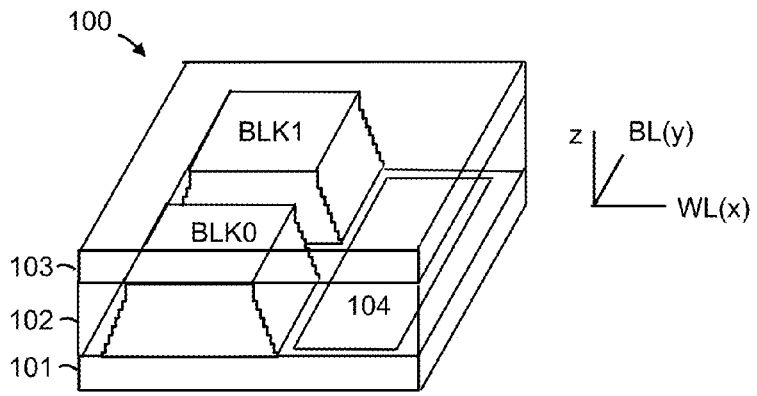
FIG. 1A is a perspective view of a 3D stacked non-volatile memory device.

Techniques are provided for reading memory cells which are subject to program disturb due to the trapping of charge in a charge trapping layer between memory cells.

One example implementation involves reading cells in a 3D stacked non-volatile memory device. In such a memory device, memory cells are formed along memory holes which extend through alternating conductive layers (word line layers) and dielectric layers in a stack. The memory cells are typically arranged in NAND strings. The memory holes comprise a continuous charge trapping layer which holds charges after a cell is programmed.

However, as such memory devices are scaled down in size, the distance (e.g., a vertical distance) between adjacent cells on a common charge trapping layer becomes smaller. As the spacing is reduced, a neighboring word line program disturb becomes significant. With this disturb, a victim memory cell on an nth word line layer (WLLn) is disturbed by the programming of an adjacent memory cell on the adjacent word line layer (WLLn+1). Program disturb causes an increase in the Vth of the victim memory cell. For example, the adjacent memory cell may be directly above the victim memory cell and on the same NAND string. This disturb is cause by the high programming voltage (Vpgm) used to program the memory cells on WLLn+1 to higher data states. For example, this higher data state can be the C state in a four state memory device which stores data in erased (Er), A, B and C states. As another example, the higher data states can be the F and G states in an eight state memory device which stores data in erased (Er), A, B, C, D, E, F and G states. This programming results in a fringing field which injects electrons into a portion of the charge trapping layer which is between the adjacent memory cells. See FIG. 9 for further details. Moreover, electron injection can also be caused by the pass voltage which is applied to WLLn when WLLn+1 is programmed. The trapped charges act as a parasitic cell which impairs the ability to read back data from the cells on WLLn. Moreover, the cells on each word line layer can be disturbed in turn as each successive word line layer is programmed and parasitic cells are formed between each adjacent pair of cells along a common charge trapping layer.

Techniques provided herein address the above-mentioned issues. In one approach, when a command to perform a read operation for selected memory cells on a selected word line (WLLn) is received, a read operation is first performed on unselected memory cells of WLLn+1 which is adjacent to WLLn. In one approach, the data state of each unselected memory cell is determined and stored. In another approach, a threshold voltage (Vth) range is determined for each unselected memory cell, where a Vth range can encompass less than one data state, one data state exactly or more than one data state. After completing the read of WLLn+1, a read operation begins for WLLn. This read operation includes multiple read processes and each read process distinguishes between different data states. In some cases, a read process applies multiple control gate voltages to a selected memory cell, senses whether the selected memory cell is in a conductive state during each of the control gate voltages and selects a result from the sensing which is optimal for the selected memory cell based on the data state or Vth range of the adjacent unselected memory cell. Once all of the optimal sensing results are obtained, the data state of the selected memory cell can be determined.

Generally, a sensing result is optimal when a lowest voltage of the control gate voltages is applied to WLLn and the data state or Vth range of the adjacent memory cell is below than this lowest voltage. For example, if the read process is for distinguishing between the erased (Er) and the A state, a sensing result using the lowest control gate is optimal if the data state of the adjacent memory cell is the Er state. The Vth of the Er state is below VrA, the read level which distinguishes between the Er and A state. On the other hand, a sensing result is optimal when an elevated voltage of the control gate voltages is applied to WLLn and the data state or Vth range of the adjacent memory cell is above this lowest voltage. For example, if the read process is for distinguishing between the erased (Er) and the A state, a sensing result using an elevated control gate is optimal if the data state of the adjacent memory cell is the A, B or C state. The Vth of the A, B or C state is above VrA, the read level which distinguishes between the Er and A state.

In some cases, the granularity of the read of the adjacent word line can be tailored based on the nonlinearity of program disturb to provide a more accurate compensation. A number of operations in the read of the adjacent word line can also be reduced compared to a full read of all data states by grouping data states which have a similar program disturb effect. The number of operations in the read of the selected word line can also be reduced by noting that compensation is not indicated in some situations.

The use of multiple control gate voltages provides an appropriate amount of compensation for the program disturb of the selected memory cell, which tends to increase the apparent Vth of the memory cell. The amount of program disturb, and the corresponding compensation, increases non-linearly, e.g., exponentially, based on an amount by which the Vth of the adjacent memory cell exceeds the Vth of the selected memory cell. Advantages of the above-mentioned techniques include providing the ability to accurately read data in memory cells which have been subject to program disturb.

The following discussion provides details of the construction of a memory device and of related programming and sensing techniques which address the above-mentioned issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
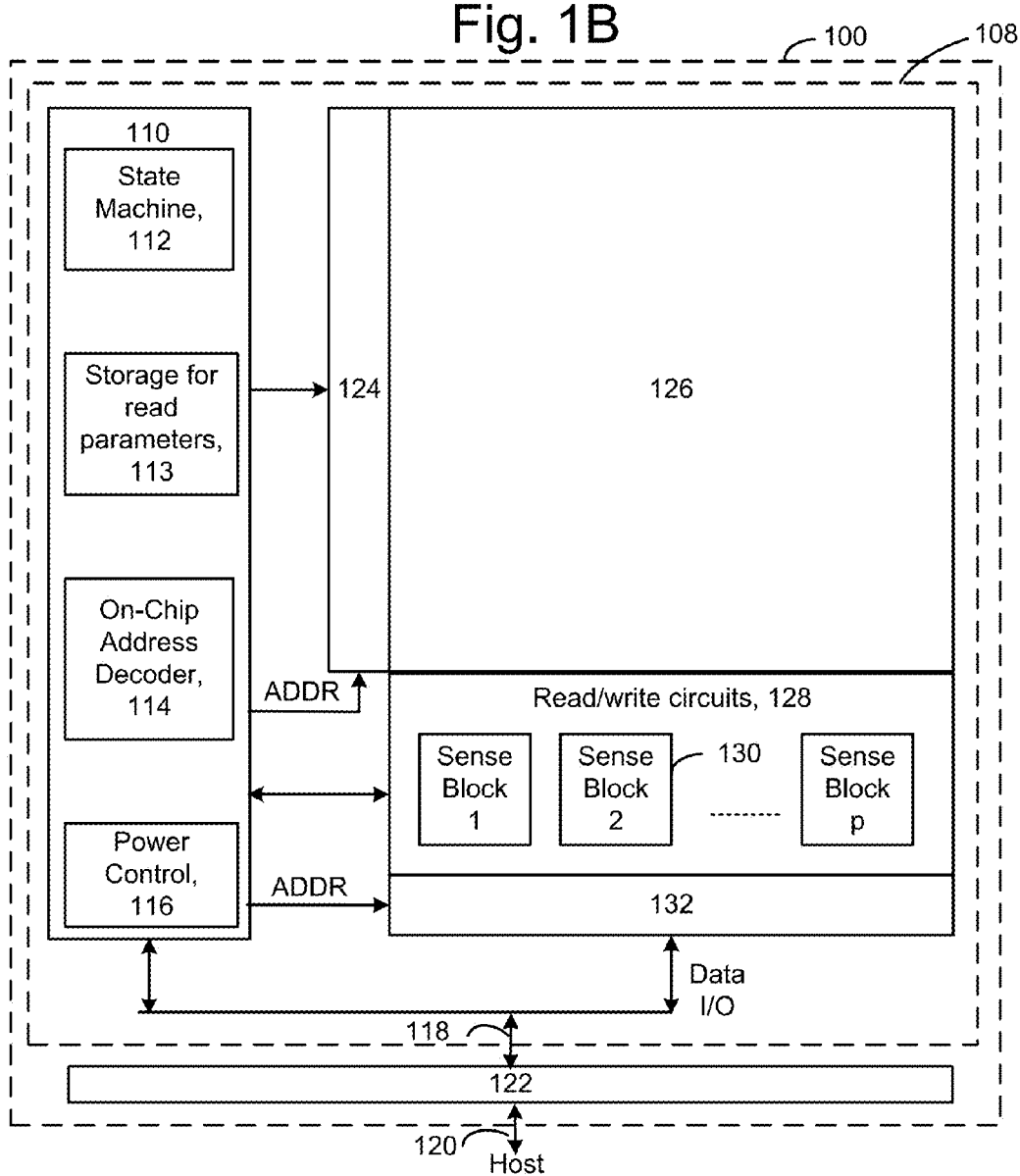
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) stacked memory array or structure 126 of memory cells, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more arrays of memory cells including a two-dimensional or a three-dimensional array. The memory structure may comprise a monolithic three-dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs, drain- and source-side select gate drivers (referring, e.g., to drain- and source-sides or ends of a string of memory cells such as a NAND string, for instance) and source lines. The sense blocks 130 can include bit line drivers, in one approach.

A storage location 113 may be provided for read parameters. As described further below, this can include pass voltages for unselected word lines, control gate read voltages, Vsource and parameters in a sensing circuitry such as sensing period, demarcation level or pre-charge level. The read parameters can also be used to implement the plots of FIG. 11B-11K. The read parameters can include data which is predetermined and data which is determined at the time of a read operation. The storage locations may use ROM fuses or data registers, for example, for the predetermined data.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another approach, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two-dimensional and three-dimensional exemplary structures described but covers all relevant memory structures within the spirit and scope of the technology as described herein and as understood by one of skill in the art.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2C, the stack includes alternating dielectric and conductive layers. The dielectric layers include D0 to D25 and may be made of SiO2, for instance. The conductive layers include BG, which is a back gate layer, WLL0 to WLL23, which are conductive paths to control gates of the memory cells at the layer, and SG, which is a select gate layer, e.g., a conductive path to control gates of select gate transistors of NAND strings. FIG. 2A may represent any one of WLL0 to WLL23, for instance, in an example with twenty-four WLLs. The conductive layers may include doped polysilicon, metal silicide or a metal, for instance. An example voltage of 5-10 V may be applied to the back gate to maintain a conductive state which connects the drain- and source-side columns.

For each block, the WLL is divided into two portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2C.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one memory cell in the source-side of each U-shaped NAND string, and WLL23D-SB is a WLL portion in communication with one memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the WLL portions 202 and 204.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set. Sets of NAND strings 210-215 are also depicted.

FIG. 2B2 depicts the block 200 FIG. 2A, showing example sets of NAND strings 210-215. The set of NAND strings 210 includes an example NAND string NS0, such as depicted in FIG. 2B5 and example memory cells MCD23-0, MCD23-1, MCD23-2, . . . , MCD23-14, as depicted in FIG. 2B6. In this notation, "MC" denotes a memory cell, "D" denotes a drain side of the NAND strings, and the number (0, 1, 2, . . . , 14) denotes a number of the NAND string based on its position in the stack. NAND strings NS0, NS0-1, NS0-2, . . . , NS0-14 are also depicted.

FIG. 2C depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0, corresponding to C0, is depicted for reference. The memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs.

The source line SL0 is connected to the source ends 240 and 242 of two adjacent memory strings NS0 and NS1. SL0 is also connected to other sets of memory strings which are behind NS0 and NS1 in the x direction. Additional U-shaped NAND strings in the stack 230 (e.g., NS0-1, NS0-2, . . . , NS0-14 from FIG. 2B6) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

Figure 3A:
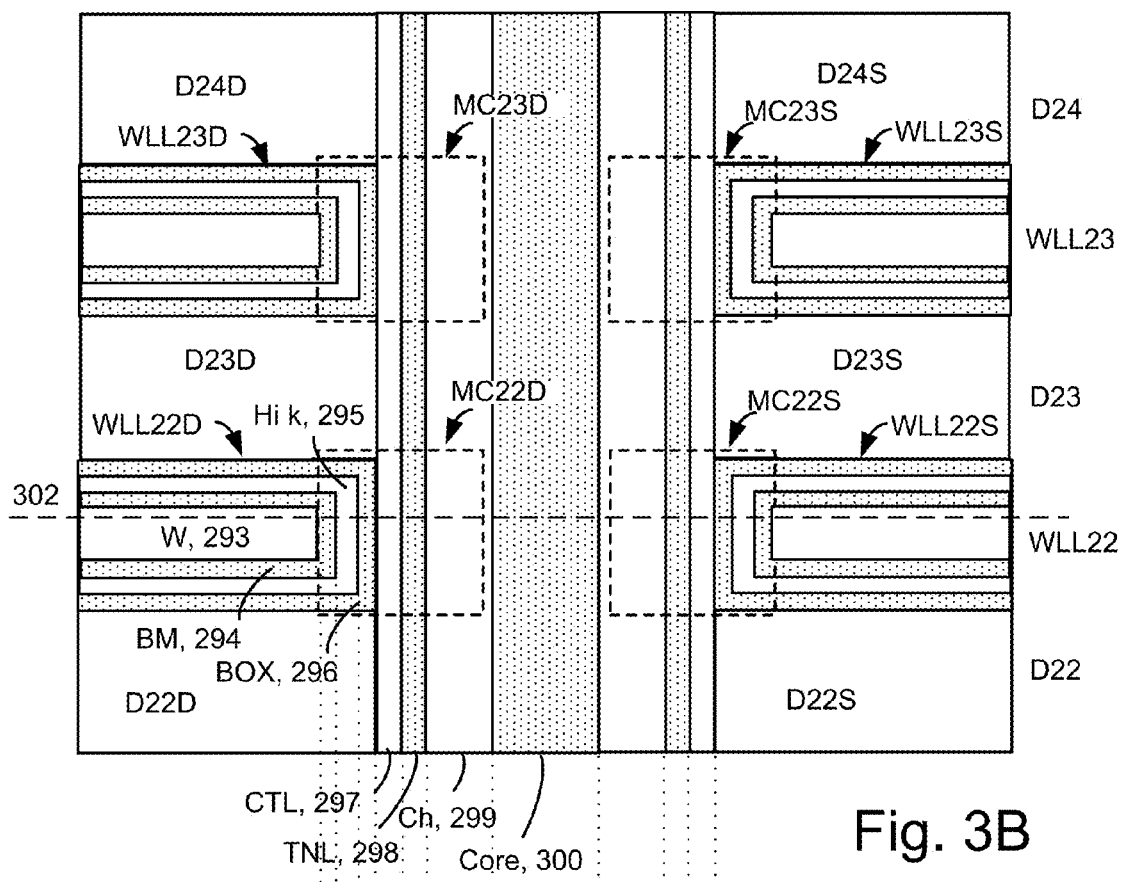
FIG. 3A depicts a close-up view of the region 236 of the column C0 of FIG. 2C, showing example memory cells MC23D, MC22D, MC23S and MC22S.

A region 236 of the stack is shown in greater detail in FIG. 3A.

Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B1. In each WLL, the diagonal line patterned region represents the source-side sub-block, and the unpatterned region represents the drain-side sub-block.

FIG. 3A depicts a close-up view of the region 236 of the column C0 of FIG. 2C, showing example memory cells MC23D, MC22D, MC23S and MC22S. The region also shows portions D24D and D24S of the dielectric layer D24, portions D23D and D23S of the dielectric layer D23, and portions D22D and D22S of the dielectric layer D22. The region also shows portions WLL24D and WLL24S of the conductive layer WLL24, portions WLL23D and WLL23S of the conductive layer WLL23, and portions WLL22D and WLL22S of the conductive layer WLL22.

A number of layers can be deposited along the sidewalls of the column and within each word line layer. These layers can include oxide-nitride-oxide (O—N—O) and polysilicon layers which are deposited, e.g., using atomic layer deposition. For example, the column includes a charge trapping layer or film (CTL) 297 such as SiN or other nitride, a tunnel oxide (TNL) 298, a polysilicon body or channel (CH) 299, and a core filler dielectric 300. The word line layer includes a block oxide (BOX) 296, a block high-k material 295, a barrier metal 294, and a conductive metal such as W 293. In another approach, all of these layers except the W are provided in the column. Additional memory cells are similarly formed throughout the columns. These layers form a columnar active area of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge.

Each respective memory cell of the first set of memory cells is adjacent to, and is arranged along a common charge trapping layer with, and in a common NAND string with, a respective memory cell of the second set of memory cells. For example, MC23D is adjacent to, and is arranged along a common charge trapping layer 297 with, MC22D. Also, MC23S is adjacent to, and is arranged along a common charge trapping layer 297 with, MC22S.

Figure 3B:
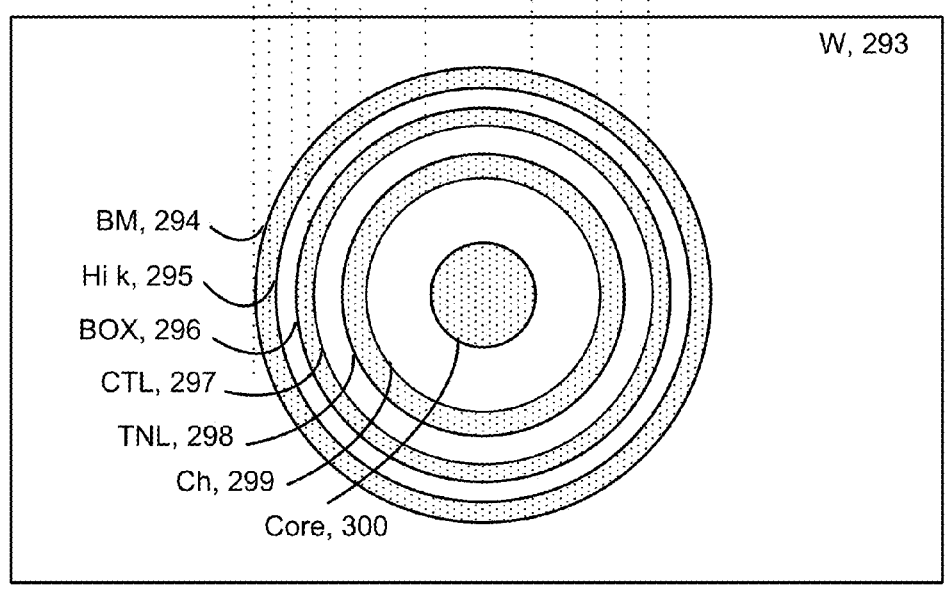
FIG. 3B depicts a cross-sectional view along line 302 of FIG. 3A.

FIG. 3B depicts a cross-sectional view along line 302 of FIG. 3A. Each layer is ring-shaped in one possible approach, except the core filler, which is a cylinder.

Figure 3C:
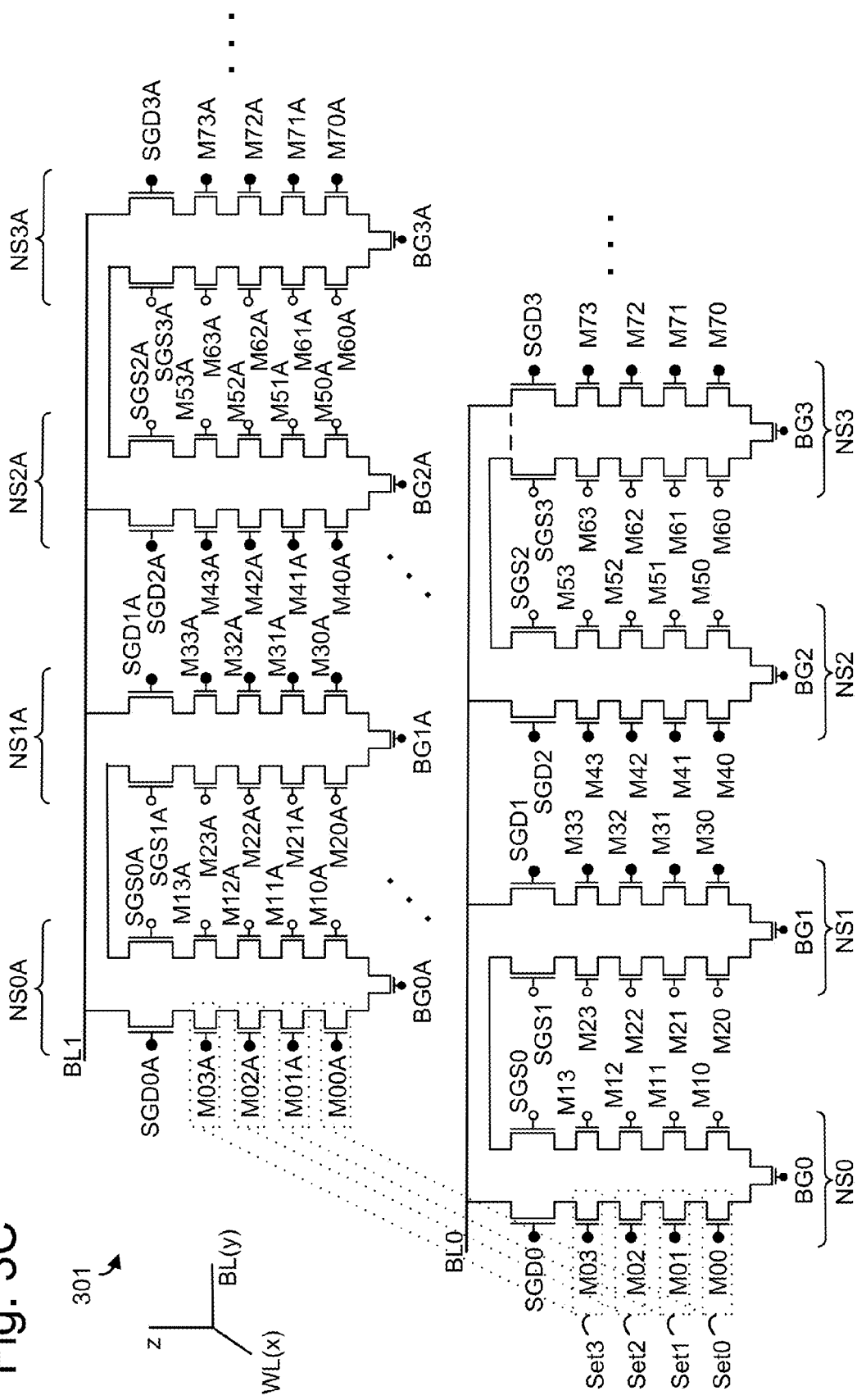
FIG. 3C depicts one embodiment of a circuit 301 in a 3D stacked non-volatile memory device.

FIG. 3C depicts one embodiment of a circuit 301 in a 3D stacked non-volatile memory device. As a simplification, four memory cells are provided per column.

NAND strings NS0, NS1, NS2 and NS3 are in communication with a bit line BL0, and NAND strings NS0A, NS1A, NS2A and NS3A are in communication with a bit line BL1. In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column COD comprising memory cells M00, M01, M02 and M03 and an SGD transistor SGD0, and a source side column C0S comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

A sets of memory cells includes cells that can be programmed or read together. For example, a set of memory cells can include cells connected to a common word line layer (WLL) portion and to a common SGD line. For example, Set0 includes cells M00-M00A, Set1 includes cells M01-M01A, Set2 includes cells M02-M02A, and Set3 includes cells M03-M03A.

At each level of the circuit, the control gates of the drain-side memory cells are connected to one another by a common WLL. For example, at the top WLL, M03, M03A, M33, M33A, M43, M43A, M73 and M73A have control gates connected by a word line layer. Similarly, the control gates of the source-side memory cells are connected to one another by a common WLL. For example, at the top WLL, M13, M13A, M23, M23A, M53, M53A, M63 and M63A have control gates connected by a word line layer.

Additionally, control gates of the SGD transistors are connected to one another. For example, control gates of SGD0, . . . , SGD0A are connected, control gates of SGD1, . . . , SGD1A are connected, control gates of SGD2, . . . , SGD2A are connected, and control gates of SGD3, . . . , SGD3A are connected.

The control gates of the SGS transistors are connected to one another in the x-direction. For example, control gates of SGS0, SGS0A are connected, control gates of SGS1, . . . , SGS1A are connected, control gates of SGS2, . . . , SGS2A are connected, and control gates of SGS3, . . . , SGS3A are connected.

FIG. 4A depicts a top view of a straight NAND string embodiment (block 480) of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one WLL which is connected to each of the memory cells of the layer.

Figure 4C:
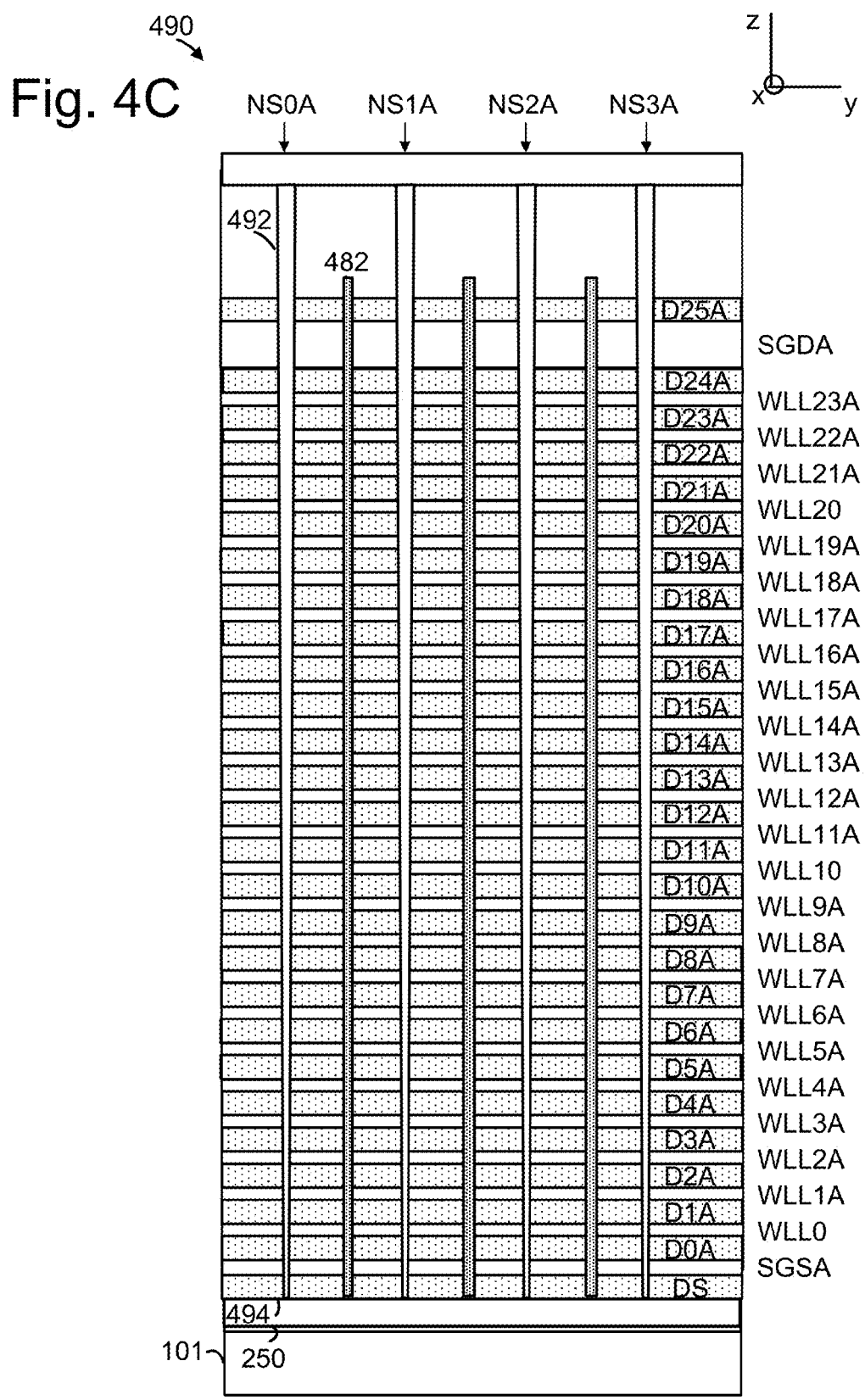
FIG. 4C depicts a cross-sectional view of the portion 488 of the block 480 of FIG. 4A along line 486.

For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216-219, 221 and 222. Example NAND strings NS0A-NS3A in the portion 488 are also depicted.

FIG. 4C depicts a cross-sectional view of the portion 488 of the block 480 of FIG. 4A along line 486. Columns of memory cells corresponding to NAND strings NS0A-NS3A in FIG. 4B2 are depicted in the multi-layer stack. In the portion, a stack 490 which includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

Figure 5A:
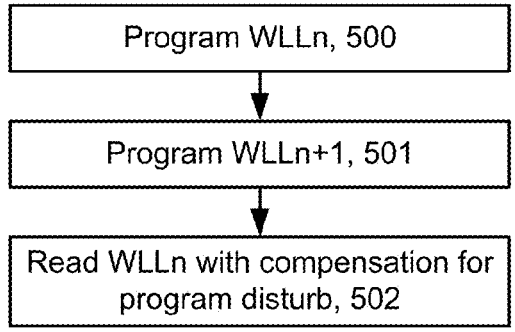
FIG. 5A depicts a process for programming and then reading memory cells in a memory device.

FIG. 5A depicts a process for programming and then reading memory cells in a memory device. In one approach, word line layers are programmed starting from a bottom layer and continuing layer by layer toward the top layer. In some cases, not all layers are used so that some layers remain in the erased state. Step 500 involves programming selected memory cells on an nth word line layer (WLLn). For example, the programming can provides the selected memory cells in four, eight or sixteen data states. Step 501 involves programming memory cells on a next higher word line layer (WLLn+1). This programming causes program disturb of the memory cells on WLLn, shifting the Vth levels higher. Step 502 involves performing a read operation for the memory cells on WLLn with compensation for the program disturb.

Figure 5B:
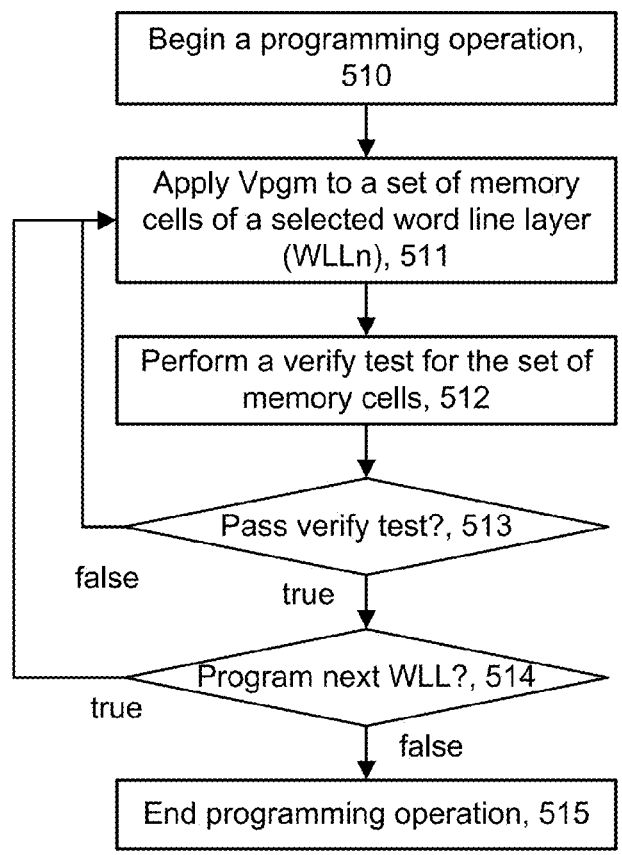
FIG. 5B depicts an example of a programming operation consistent with step 500 and 501 of FIG. 5A.

FIG. 5B depicts an example of a programming operation consistent with step 500 and 501 of FIG. 5A. A programming operation begins at step 510. Step 511 includes applying Vpgm to a set of memory cells on a selected WLL. Step 512 includes performing a verify test for the set of memory cells. For example, sensing circuitry which is connected to the bit lines can be used to sense a conductive or non-conductive state of the cells. A cell which is in a non-conductive state has passed a verify test and is locked out from further programming. Specifically, for a cell which is in a non-conductive state when a certain control gate voltage is applied, it is concluded that the Vth of the cell is higher than the control gate voltage. The data state of a cell can be determined based on the highest control gate voltage which can be applied while still observing the cell to be in a non-conductive state. For example, if such a highest control gate is VrA, VrB or VrC, the cell is in the A, B or C state. If the cell is in a conductive state when any control gate voltage is applied, it is concluded that the cell is in the erased state.

Decision step 513 determines whether the set of memory cells has passed the verify test. Typically, this requires that all, or almost all of the cells have passed their respective verify tests. If decision step 513 is false, a next programming pulse is applied at step 511. If decision step 513 is true, decision step 514 determines whether there is a next WLL to program. If decision step 514 is false, the programming operation has ended at step 515. If decision step 514 is true, a next programming pulse is applied at step 511.

FIG. 5C depicts an example of a reading operation consistent with step 502 of FIG. 5A. Step 530 involves receiving a read command to read selected memory cells of WLLn. For example, the command may be issued by the host, outside the memory device, to the controller 122 and from the controller to the state machine. In other cases, the command is issued from within the memory device, in the controller. The state machine can then communicate a read command to the sense blocks, identifying the word line to be read and optionally, a specific group or page of memory cells within the word line.

Step 531 involves reading unselected memory cells of WLLn+1 to determine a Vth range (such as a data state) for each unselected memory cell, and stores the read results such as in latches. For example, latches can be used which have the capability of storing data which is read from WLLn+1 and WLLn. Specifically, for a set of memory cells to be read on WLLn, a corresponding set of adjacent memory cells are read on WLLn+1. The set of memory cells to be read on WLLn can be all, or only a portion, of all memory cells on WLLn. As indicated at step 532, each Vth range can encompass part of a data state, exactly one data state, or multiple data states, or a combination of one or more data states and a part of a data state. For example, see FIGS. 13A, 13B, 14A and 14B.

Step 533 involves beginning a read operation for the selected memory cell. The read operation may begin immediately after completion of the read operation on WLLn+1, for instance, or at a later time such as when the processing resources of the memory device are not performing another, higher priority task. Step 535 begins the read operation for the selected memory cells. A read operation can comprise multiple read processes, where each read process can distinguish between different adjacent data states (e.g., Er and A, or A and B or B and C).

Step 535 begins a read process for the selected memory cells to distinguish between adjacent data states. At step 534, each read process can include one or more control gate voltages and corresponding sensing operations. Step 536 applies a control gate voltage to WLLn while sensing whether the selected memory cells are in a conductive state. Step 537 selects the sensing result from step 536 for each selected memory cell if it is optimal based on the Vth range of the adjacent unselected memory cell. For example, see FIG. 15A1, where a first voltage of a set of control gate voltages 1500 is applied to WLLn while a first sensing result SR1a is obtained. This sensing result is optimal for a selected memory cell when the adjacent memory cell is in the Er state. This sensing result is not optimal for a selected memory cell when the adjacent memory cell is in the A, B or C state. For a selected memory cell, selecting the sensing result for a read process means using the sensing result to evaluate the Vth of the selected memory cell relative to the data state being distinguished by the read process.

Decision step 538 determines if there is a next control gate voltage in the read process. If the answer is yes, step 536 is performed using the next control gate voltage. For example, this could be the control gate voltage which provides compensation for when the adjacent memory cell is in the A state. A sensing result SR1*b* is obtained. In FIG. 15A1, this occurs during the second voltage of the set of voltages 1500. The read process similarly obtains sensing results SR1*c* and SR1*d* which are optimal for when the adjacent memory cell is in the B or C state, respectively. In FIG. 15A1, this occurs during the third and fourth voltages of the set of voltages 1500.

If the answer to decision step 538 is no, a decision step 539 determines if there is a next read process in the read operation. If the answer is yes, step 535 is reached and a next read process begins for distinguishing the next adjacent data states. For example, the first read process can distinguish between the E and A states, the second read process can distinguish the A and B states, and the third read process can distinguish the B and C states. In the example of FIG. 15A1, in a second read process, a set of control gate voltages 1510 includes first and second control gate voltages which provide a sensing result SR2*a* or SR2*b* which is optimal when the adjacent memory cell is in the E or A state, respectively, a third control gate voltage which provides a sensing result SR2*c* which is optimal when the adjacent memory cell is in the B state, and a fourth third control gate voltage which provides a sensing result SR2*d* which is optimal when the adjacent memory cell is in the C state. In a third read process, a set of control gate voltages 1520 includes first, second and third control gate voltages which provide a sensing result SR3*a*, SR3*b* or SR3*c* which are optimal when the adjacent memory cell is in the Er, A or B state, respectively, and a fourth control gate voltage which provides a sensing result SR3*d* which is optimal when the adjacent memory cell is in the C state.

If the answer to decision step 539 is no, the read operation has completed at step 540. The data which is read from WLLn can be transferred from latches and out to the state machine, controller and host.

Figure 6A:
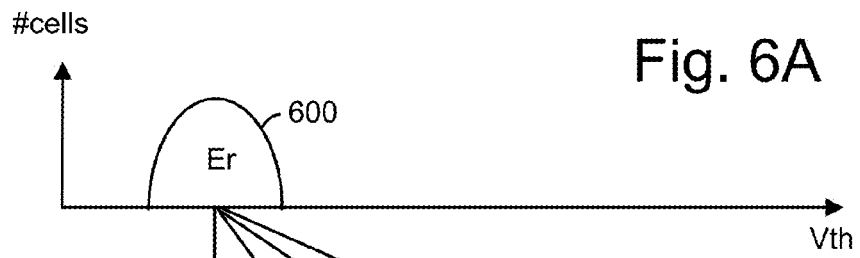
FIGS. 6A and 6B depict a one pass programming operation with four data states consistent with FIG. 5B.
Figure 6B:
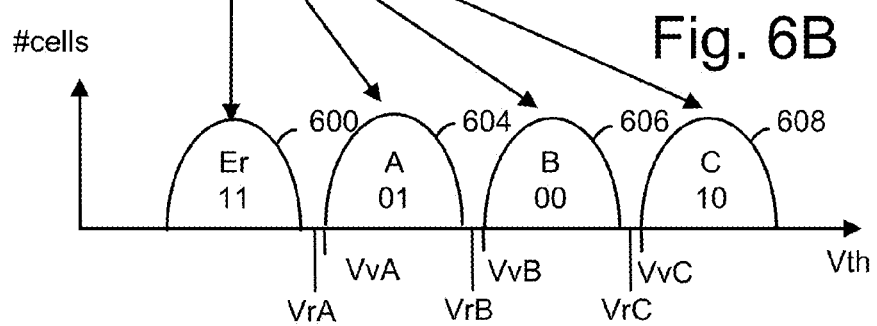

FIGS. 6A and 6B depict a one pass programming operation with four data states consistent with FIG. 5B. One pass programming involves a sequence of multiple program-verify operations which are performed starting from an initial Vpgm level and proceeding to a final Vpgm level until the threshold voltages of a set of selected memory cells reach one or more respective verify levels of respective target data states. All memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 600 is provided for erased (Er) state memory cells. Three Vth distributions 604, 606 and 608 represent target data states A, B and C, respectively, which are reached by memory cells when their Vth exceeds the verify level VvA, VvB or VvC, respectively. In this case, each memory cell can store two bits of data in one of four possible Vth ranges, referred to as states Er (or E), A, B and C.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a cell erroneously shifts to its neighboring physical state, only one bit will be affected. One example assigns "11," "01," "00" and "10" to the Er, A, B and C states. Read reference voltages which are between the distributions are used for reading data from the memory cells. By testing whether the Vth of a given memory cell is above or below one or more of the read reference voltages, the system can determine the data state which is represented by a memory cell.

One pass programming is commonly used with three-dimensional memory devices

Figure 7A:
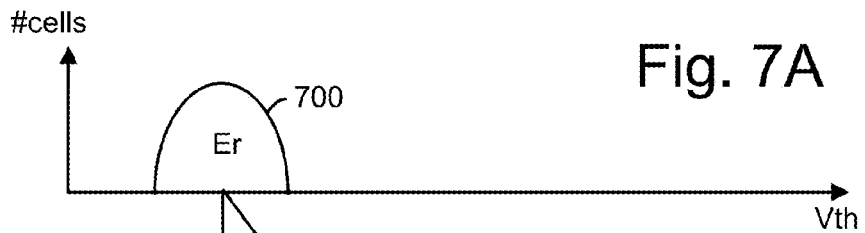
FIGS. 7A to 7C depict a two-pass programming operation with four data states consistent with FIG. 5B.
Figure 7B:
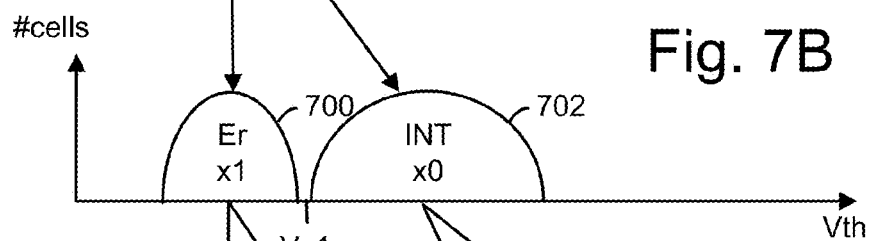
Figure 7C:
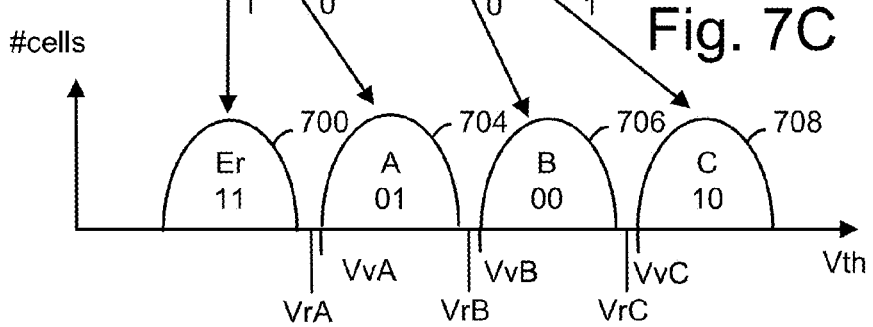

FIGS. 7A to 7C depict a two-pass programming operation with four data states consistent with FIG. 5B. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 700 in FIG. 7A.

FIG. 7B depicts programming of a lower page of data. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify level Vv1. The data of these memory cells is represented by x0. Note that the interim distribution can be relatively wide since it is not a final distribution and does not represent a final data state.

FIG. 7C depicts programming of an upper page of data. If UP/LP=11, the associated memory cell in the distribution 700 remains in the distribution 700 and stores data bits 11. If UP/LP=01, the memory cells in the distribution 700 are programmed to the distribution 704. If UP/LP=10, the memory cells in the distribution 702 are programmed to the distribution 708 (state C). If UP/LP=00, the memory cells in the distribution 702 are programmed to the distribution 706 (state B).

Programming can be similarly extended to three or more bits per memory cell.

Figure 8:
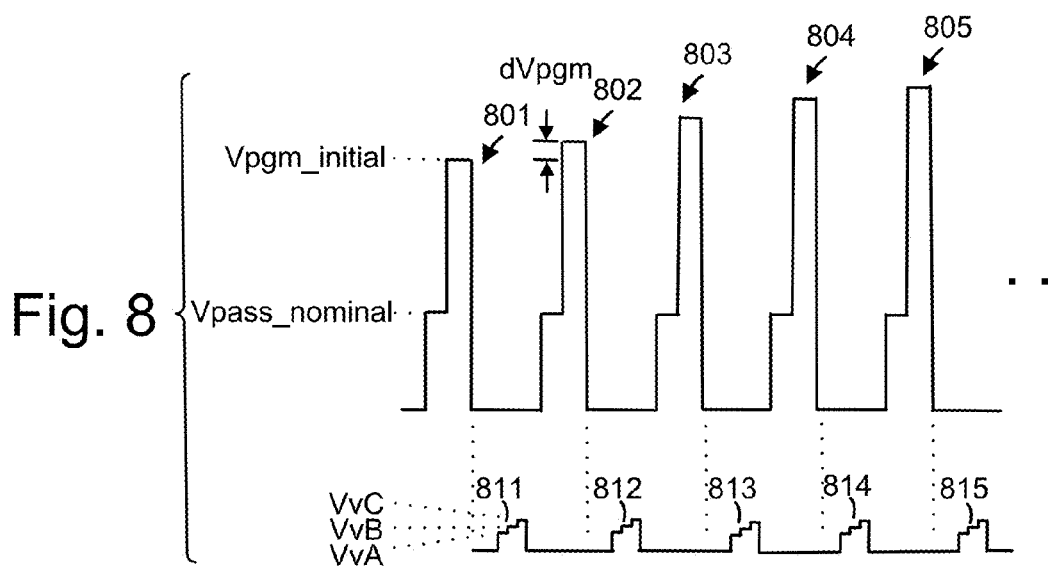
FIG. 8 depicts program and verify voltages in a programming operation, consistent with FIG. 5B.

FIG. 8 depicts program and verify voltages in a programming operation, consistent with FIG. 5B. A programming operation may include multiple program-verify iterations or loops, where each program-verify iteration includes a programming portion comprising a program pulse and a following verify operation comprising one or more verify voltages. The program pulse and verify voltages are applied to a selected WLL.

In one approach, the program pulses are stepped up in successive iterations by a step size. Moreover, each program pulse may include a first portion which has a pass voltage (Vpass) level, e.g., 6-8 V, followed by a second, peak amplitude portion at a program level, e.g., 12-25 V. For example, this programming pass includes program pulses 801-805 and associated sets of verify pulses 811-815, respectively. The initial program pulse has a magnitude of Vpgm initial. In this example, the verify pulses have a magnitude of VvA, VvB and VvC.

Figure 9:
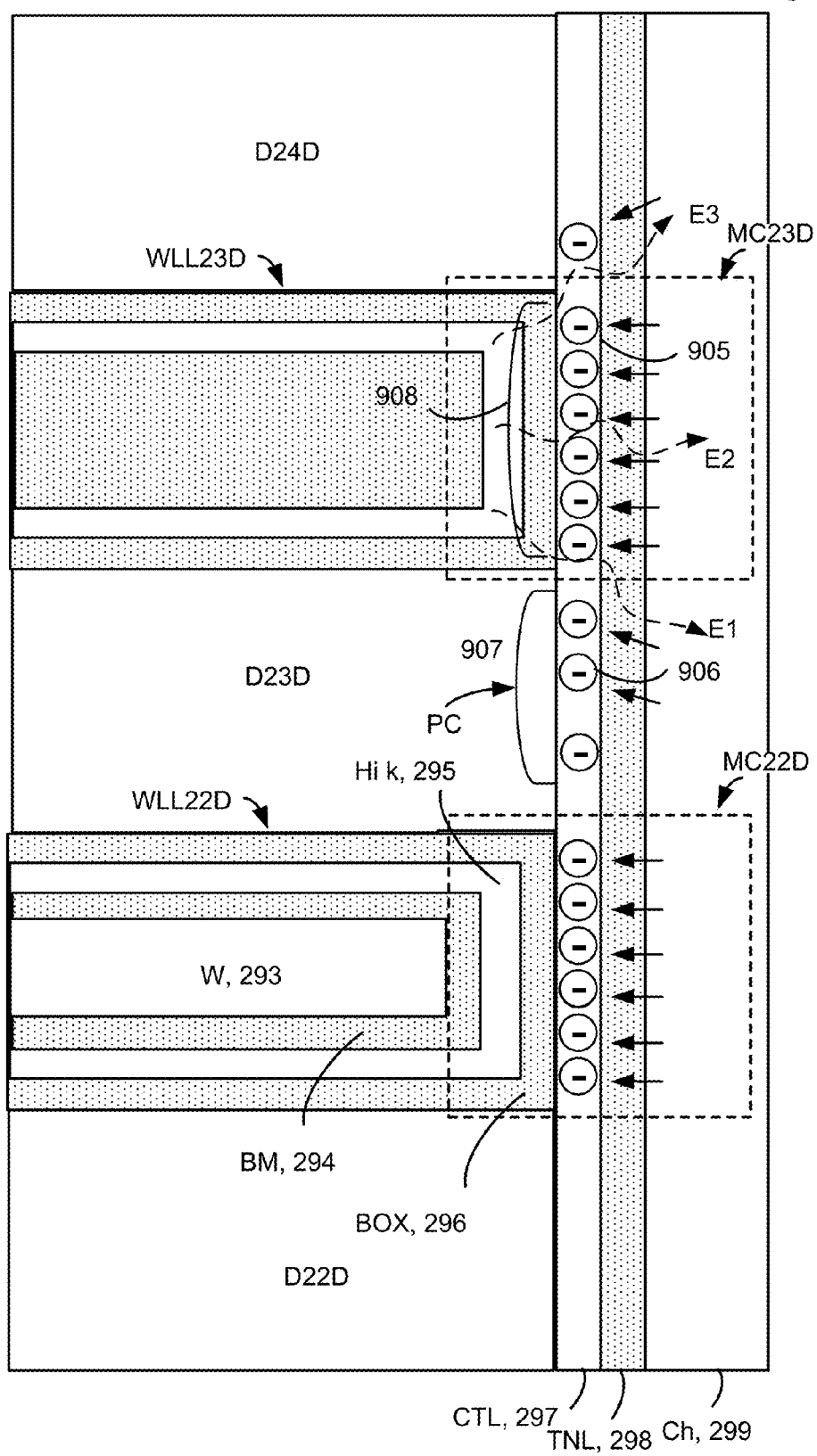
FIG. 9 depicts a close up view of a portion of the example memory cells MC22D and MC23D of FIG. 3B, showing electron injection in a charge trapping layer between memory cells.

FIG. 9 depicts a close up view of a portion of the example memory cells MC22D and MC23D of FIG. 3B, showing electron injection in a charge trapping layer between memory cells. This figure is consistent with FIG. 3A. In this program disturb model, when MC23D on a neighbor WLL (e.g., WLLn+1) is programmed, a strong fringing field is caused by the use of a high Vpgm on WLLn+1. The application of Vpgm results in a primary electromagnetic field E2 which causes electron injection from the channel 299 to a portion 908 of the charge trapping layer 297 which is within the memory cell MC23D, e.g., adjacent to the WLL. See example electron 905. However, fringing fields E1 and E3 are also generated which cause electron injection from the channel 299 to portions of the charge trapping layer 297 which are outside the memory cell MC23D. See example electron 906 in a portion 907 of the charge trapping layer which is between the memory cells MC23D and MC22D.

These charges can result in a parasitic memory cell (PC) which has a non-zero threshold voltage. As a result, during a read operation on WLLn, a higher control gate voltage may be needed to provide a fringing field from MC22D which causes the parasitic cell to become conductive and to thereby allow sensing of MC22D. The control gate voltages used for the lower data states may not be sufficient to cause the parasitic cell to become highly conductive. As a result, reading of lower data states can be significantly impaired. On the other hand, the control gate voltages used for the higher data states may be sufficient to cause the parasitic cell to become highly conductive, so that reading of higher data states is impaired by a smaller amount.

Due to the parasitic cell, there is an upshift in the Vth of a memory cell which is sensed after the adjacent cell is programmed. However, this program disturb effect is nonlinear, such that the Vth of a victim memory cell, e.g., MC22D, from an attacker memory cell, e.g., MC23D, will remain essentially constant until a sufficiently high Vpgm is applied to MC23D. This Vpgm is about the same as the final Vpgm used to program MC22D. After this point, the Vth upshift begins. This occurs because the parasitic cell between MC22D and MC23D is partly programmed during WLLn programming, and will not react to the Vpgm level during WLLn+1 programming unless the Vpgm level is higher than the final WLLn Vpgm level. Beyond that point, the parasitic cell is further programmed by the even higher Vpgm on WLLn+1.

The parasitic cell between WLLn and WLLn+1 impairs the ability to accurately sense the Vth of a memory cell on WLLn. Providing different control gate voltages during a read process, and selecting an optimal sensing result using one of the control gate voltages, helps to overcome this problem.

Note that multiple parasitic cells may be present between multiple adjacent word line layers. However, during a read on WLLn, a pass voltage is applied to the remaining word lines which is high enough to provide the memory cells of the remaining word lines and the parasitic cells between these memory cells in a conductive state so they do not affect the sensed Vth level on WLLn.

The formation of a parasitic cell is particularly problematic in three-dimensional memory devices. However, the techniques described herein can also be used in two-dimensional memory devices which include memory cells with charge trapping layers or floating gates. Generally, the parasitic cell can occur in a continuous memory film (e.g., comprising the CTL 297) which extends across multiple word line layers, and in a portion of the continuous memory film which is between adjacent word line layers.

Note that the charge trapping layer extends vertically in this example and the word line layers extend horizontally. However, other configurations are possible. For example, the charge trapping layer could extend horizontally while the word line layers extend vertically.

Figure 10B:
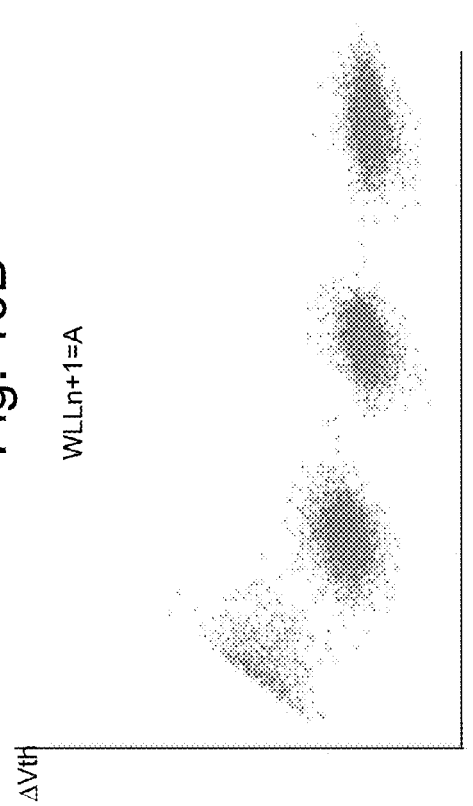
FIG. 10B depicts a change in Vth of a memory cell on WLLn due to program disturb from a memory cell in the A state on WLLn+1.
Figure 10D:
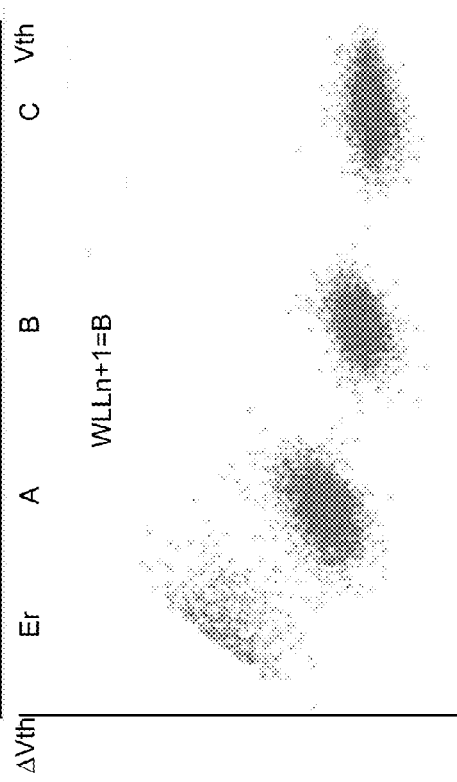
FIG. 10D depicts a change in Vth of a memory cell on WLLn due to program disturb from a memory cell in the C state on WLLn+1.
Figure 10A:
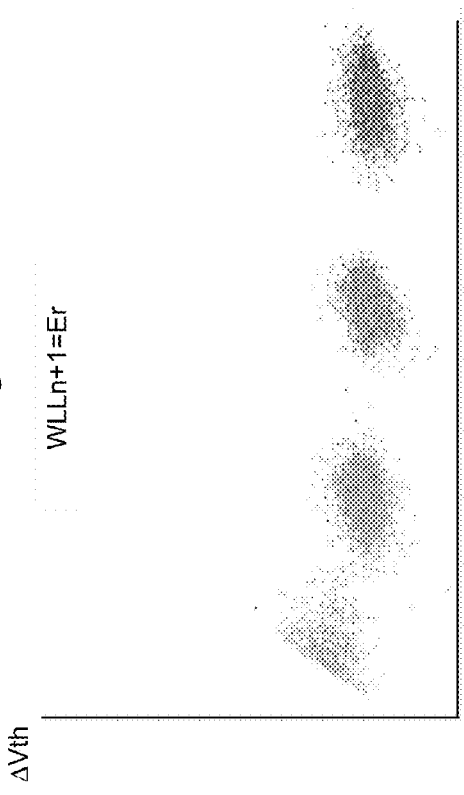
FIG. 10A depicts a change in Vth of a memory cell on WLLn due to program disturb from a memory cell in the Er state on WLLn+1.

FIG. 10A depicts a change in Vth of a memory cell on WLLn due to program disturb from a memory cell in the Er state on WLLn+1. FIG. 10A to 10D provide scatter plots where a cloud of points is depicted and each point corresponds to one selected memory cell. In FIG. 10A to 10D, the horizontal axis depicts Vth of the memory cells on WLLn and the vertical axis depicts a change in the Vth as a function of a data state of the adjacent memory cell on WLLn+1. The plots of FIG. 10A to 10D have equal scales on their horizontal axes and equal scales on their vertical axes. The plot of FIG. 10A shows that there is a relatively small increase in the Vth of the memory cells of WLLn in the erased state but not for the higher states (A, B and C).

Generally, the upshift in the Vth of a memory cell on WLLn is a function of the data state (or Vth) of the adjacent memory cell on WLLn+1 and the data state (or Vth) of the memory cell on WLLn. If the memory cell on WLLn cell is programmed to a relatively high Vth, the traps between the word line layers are filled and the programming of the memory cell on WLLn+1 cell causes little or no program disturb to WLLn. If the memory cell on WLLn cell is programmed to a relatively low Vth, the traps are empty and the Vth of the memory cell on WLLn+1 cell determines if the traps become filled. The traps become filled and cause program disturb if the Vth of the memory cell on WLLn+1 is relatively high.

FIG. 10B depicts a change in Vth of a memory cell on WLLn due to program disturb from a memory cell in the A state on WLLn+1. The plot shows that there is a larger increase in the Vth of the memory cells of WLLn in the erased state and a small increase for the A state.

Figure 10C:
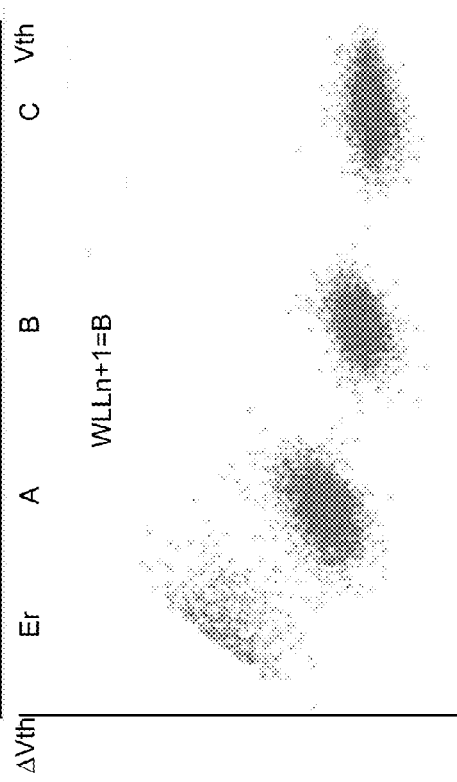
FIG. 10C depicts a change in Vth of a memory cell on WLLn due to program disturb from a memory cell in the B state on WLLn+1.

FIG. 10C depicts a change in Vth of a memory cell on WLLn due to program disturb from a memory cell in the B state on WLLn+1. The plot shows an even larger increase in the Vth of the memory cells of WLLn in the erased state and the A state and a small increase for the B state.

FIG. 10D depicts a change in Vth of a memory cell on WLLn due to program disturb from a memory cell in the C state on WLLn+1. The plot shows a substantial larger increase in the Vth of the memory cells of WLLn in the erased state and more moderate increase for the A and B states. These plots indicate that an upshift in Vth due to program disturb increases nonlinearly in proportion to an amount by which the Vth of a memory cell on WLLn+1 exceeds the Vth of a memory cell on WLLn.

FIG. 11A depicts an alternative view of the data of FIG. 10A, where a shift in Vth due to program disturb is depicted on the horizontal axis and a number of memory cells is depicted on the vertical axis. In FIG. 11A to 11D, the horizontal axis depicts a change in Vth of the memory cells on WLLn (corresponding to the vertical axes in FIG. 10A to 10, respectively) and the vertical axis depicts a number of memory cells on a logarithmic scale. The plots of FIG. 11A to 11D have equal scales on their horizontal axes and equal scales on their vertical axes. Each plot has four lines which are marked with a square, circle, inverted triangle, or upright triangle to denote the cases where the memory cells on WLLn are in the Er, A, B or C states, respectively. The plots are similar to probability distributions in that the highest point of the plot represents the most probable case for a memory cell of a given data state on WLLn. FIG. 11A indicates that the most probable case for the A, B and C state memory cells on WLLn is a 0 V upshift in Vth. The most probable case for the Er state memory cells on WLLn is a Vth upshift of a voltage V1$a$.

FIG. 11B depicts an alternative view of the data of FIG. 10B, where a shift in Vth due to program disturb is depicted on the horizontal axis and a number of memory cells is depicted on the vertical axis. The most probable case for the B and C state memory cells on WLLn is a 0 V upshift in Vth. The most probable case for the Er and A state memory cells on WLLn is a Vth upshift of V1$b$ and V2$b$<V1$b$, respectively.

FIG. 11C depicts an alternative view of the data of FIG. 10C, where a shift in Vth due to program disturb is depicted on the horizontal axis and a number of memory cells is depicted on the vertical axis. The most probable case for the C state memory cells on WLLn is a 0 V upshift in Vth. The most probable case for the Er, A and B state memory cells on WLLn is a Vth upshift of V1c, V2c and V3c, respectively, where V1c>V2c>V3c.

FIG. 11D depicts an alternative view of the data of FIG. 10D, where a shift in Vth due to program disturb is depicted on the horizontal axis and a number of memory cells is depicted on the vertical axis. The most probable case for the Er, A, B and C state memory cells on WLLn is a Vth upshift of V1d, V2d, V3d and V4d, respectively, where V1d>V2d>V3d>V4d.

Further, for the Er state memory cells on WLLn, V1a<V1b<V1c<V1d. For the A state memory cells on WLLn, V2b<V2c<V2d. For the B state memory cells on WLLn, V2c<V2d. For the C state memory cells on WLLn, the most probable upshift=0 V except for V4d>0. Thus, there is a nonlinearly increasing upshift in Vth in the memory cells on WLLn as a function of the data state of the memory cells on WLLn+1.

Figure 12A:
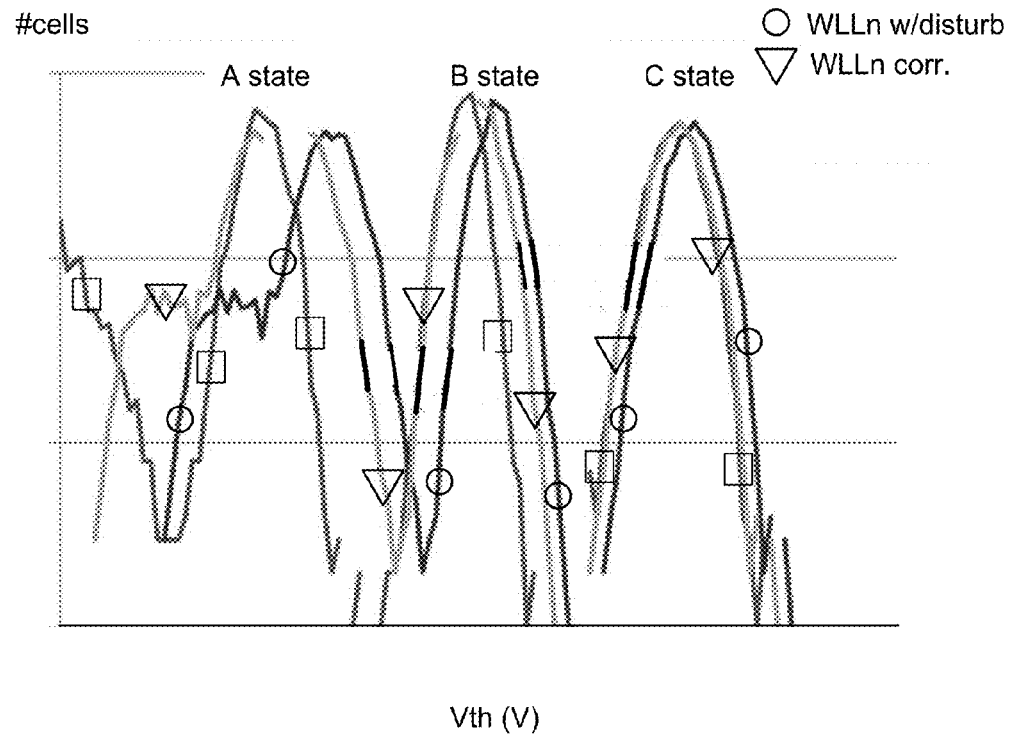
FIG. 12A depicts a Vth distribution of memory cells on WLLn: a) initially, before program disturb due to WLLn+1 (line with squares), b) with program disturb (line with circles), and c) with a correction for program disturb (line with inverted triangles), for memory cells on WLLn which are adjacent to C-state memory cells on WLLn+1 to represent a worst case of program disturb.

FIG. 12A depicts a Vth distribution of memory cells on WLLn: a) initially, before program disturb due to WLLn+1 (line with squares), b) with program disturb (line with circles), and c) with a correction for program disturb (line with inverted triangles), for memory cells on WLLn which are adjacent to C-state memory cells on WLLn+1 to represent a worst case of program disturb. The Vth distribution includes the A, B and C states. The initial Vth distribution exists after WLLn is programmed but before WLLn+1 is programmed so there is no program disturb on WLLn. The distribution with disturb is obtained after WLLn is programmed and, subsequently, WLLn+1 is programmed. The distribution with correction is an effective distribution which is obtained by down-shifting the distribution with program disturb. A goal is to provide a compensation which aligns the lower tails of the distribution with the distribution of cells on WLLn which are not adjacent to a C state cell on WLLn+1.

Figure 12B:
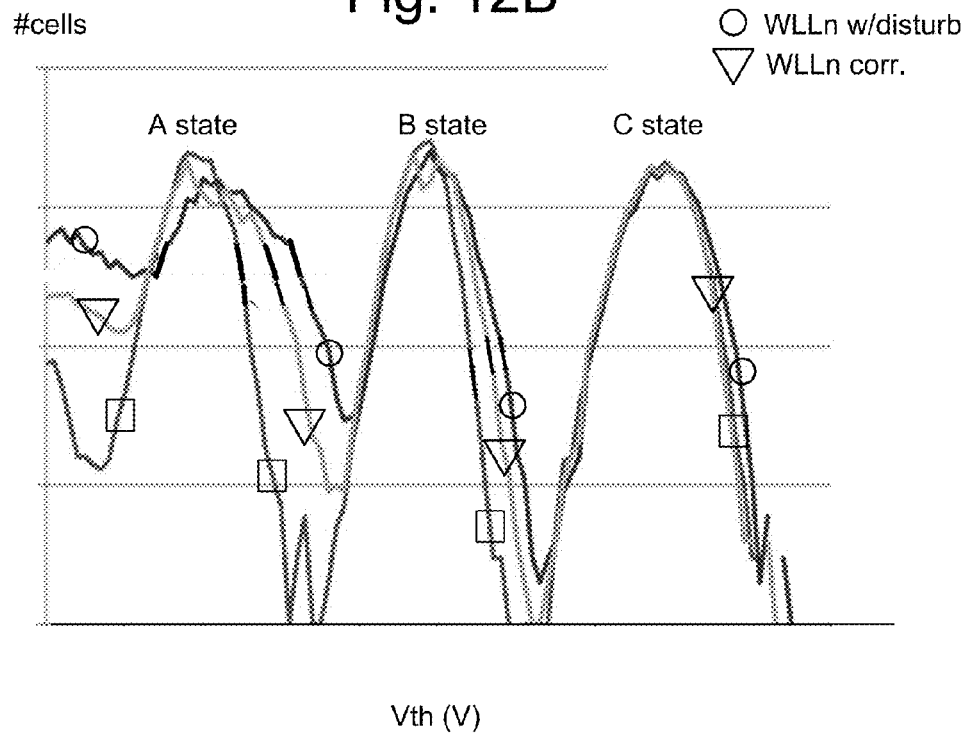
FIG. 12B depicts a Vth distribution of memory cells on WLLn: a) initially, before program disturb due to WLLn+1 (line with squares), b) with program disturb (line with circles), and c) with a correction for program disturb (line with inverted triangles), where the memory cells on WLLn+1 are in the Er, A, B or C states to represent a typical case of program disturb.

FIG. 12B depicts a Vth distribution of memory cells on WLLn: a) initially, before program disturb due to WLLn+1 (line with squares), b) with program disturb (line with circles), and c) with a correction for program disturb (line with inverted triangles), where the memory cells on WLLn+1 are in the Er, A, B or C states to represent a typical case of program disturb. The increase in the Vth of the upper tail is greatest for the lower (A) state cells and least for the higher (C) state cells. The corrected Vth distribution provides a significant improvement for the upper tail of each data state.

Figure 13A:
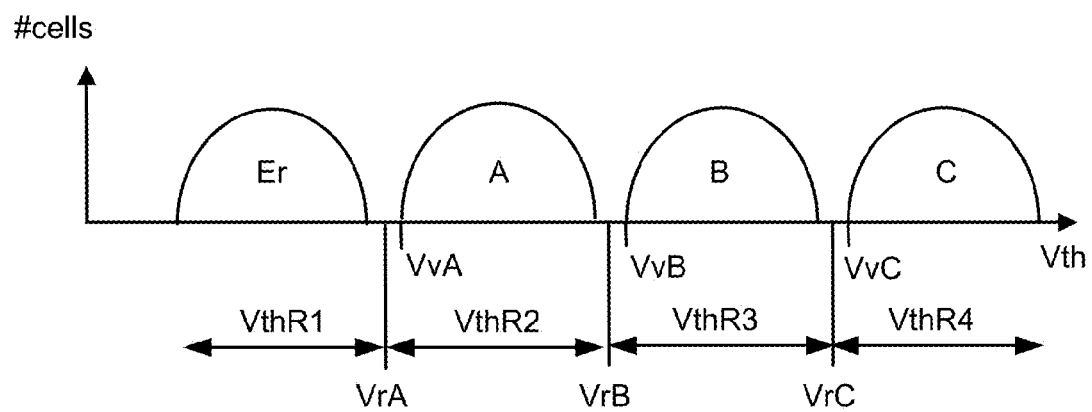
FIG. 13A depicts Vth ranges for unselected memory cell on WLLn+1, with one Vth range per data state and four total data states, as an example of step 532 of FIG. 5C.

FIG. 13A depicts Vth ranges for unselected memory cell on WLLn+1, with one Vth range per data state and four total data states, as an example of step 532 of FIG. 5C. The horizontal axis depicts Vth and the vertical axis depicts a number of memory cells on a logarithmic scale. As mentioned, each Vth range can encompass part of a data state, one data state or multiple data states. In this example, each Vth range encompasses (e.g., spans) exactly one data state, e.g., a range of Vth which is associated with one data state. Specifically, Vth ranges VthR1, VthR2, VthR3 and VthR4 encompass the Er, A, B and C states, respectively. The Vth ranges may be equal in width, in one approach. Read voltages of VrA, VrB and VrC are used to demarcate between the Er and A states, A and B states, and B and C states, respectively.

Figure 13B:
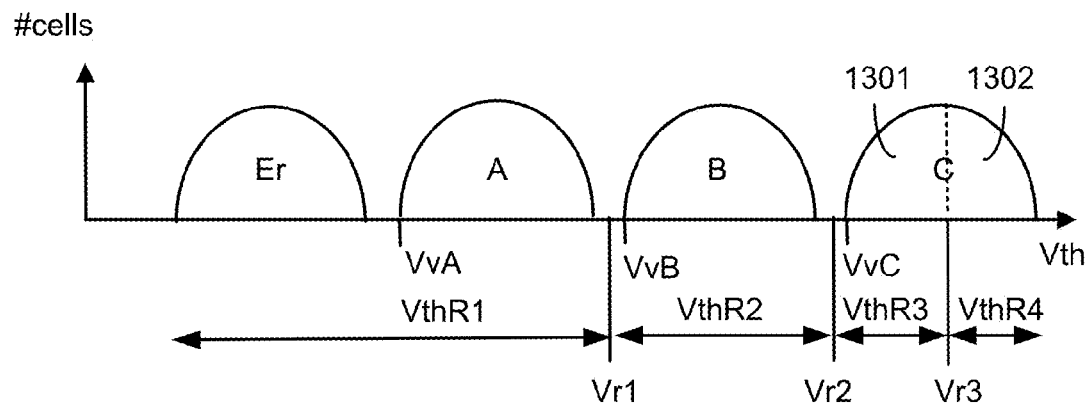
FIG. 13B depicts Vth ranges for unselected memory cell on WLLn+1, with two Vth ranges for the highest data state (C), one Vth range for the next data state (B), and one Vth range for the lowest two data states (Er and A), and four total data states, as an example of step 532 of FIG. 5C.

FIG. 13B depicts Vth ranges for unselected memory cell on WLLn+1, with two Vth ranges for the highest data state (C), one Vth range for the next data state (B), and one Vth range for the lowest two data states (Er and A), and four total data states, as an example of step 532 of FIG. 5C. In this example, VthR4 encompasses a higher portion of the C state (such as a top half), VthR3 encompasses a lower portion of the C state (such as a bottom half), VthR2 encompasses the B state and VthR1 encompasses the Er and A states. The number of voltage ranges is the same as in FIG. 13A, but the voltage ranges are of different widths, with a highest voltage range (VthR4) having the smallest width and the lowest voltage range (VthR1) having the largest width. Further, the C state distribution is split into two portions: upper and lower, or highest and next highest. A state could be split into two or more portions. This approach allows the compensation for program disturb to be made with a finer granularity since the Vth of the memory cell which caused the disturb is known more accurately. Also, due to the nonlinearity of the program disturb, the amount of program disturb and the corresponding compensation can differ substantially with a small change in the Vth of the adjacent memory cell, even a change within one data state's Vth distribution. That is, a memory cell on WLLn+1 in VthR4 will cause greater program disturb than a memory cell on WLLn+1 in VthR3. A control gate voltage on WLLn can therefore be compensated more strongly in the former case.

In this example, the Vth range (VthR4) of the unselected memory cell encompasses a highest portion 1302 of a highest data state (C) of the plurality of data states, and a next lower threshold voltage range (VthR3) of the plurality of threshold voltage ranges which is adjacent to the threshold voltage range (VthR4) of the unselected memory cell encompasses a next highest portion (1301) of the highest data state. That is, the threshold voltage range of the unselected memory cell is defined with a granularity of less than one data state, so that the threshold voltage range of the unselected memory cell encompasses less than the Vth range of one data state. The Vth range of one data state can be a predetermined value, in one approach.

FIG. 13B is also an example of the plurality of threshold voltage ranges comprising a highest threshold voltage range (VthR4) and a lowest threshold voltage range (VthR1), where the highest threshold voltage range is smaller than the lowest threshold voltage range. Also, the highest threshold voltage range (VthR4) encompasses a highest data state (C) of the plurality of data states and the lowest threshold voltage range (VthR1) encompasses a lowest data state (A) of the plurality of data state.

Since the number of voltage ranges is the same as in FIG. 13A, the number of read voltages and the read time is the same. Read voltages of Vr1, Vr2 and Vr3 are used to demarcate between VthR1 and VthR2, VthR2 and VthR3, and VthR3 and VthR4, respectively.

Figure 14A:
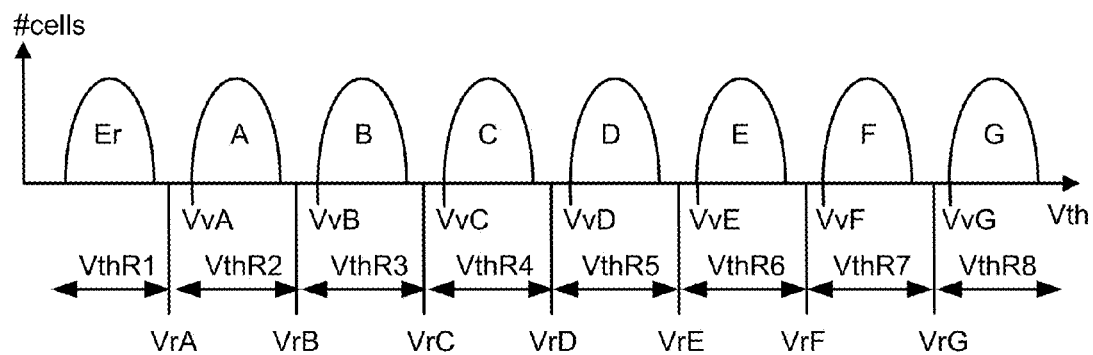
FIG. 14A depicts Vth ranges for unselected memory cell on WLLn+1, with one Vth range per data state and eight total data states, as an example of step 532 of FIG. 5C.

FIG. 14A depicts Vth ranges for unselected memory cell on WLLn+1, with one Vth range per data state and eight total data states, as an example of step 532 of FIG. 5C. The horizontal axis depicts Vth and the vertical axis depicts a number of memory cells on a logarithmic scale. In this example, each Vth range encompasses exactly one data state. Specifically, Vth ranges VthR1, VthR2, VthR3, VthR4, VthR5, VthR6, VthR7 and VthR8 encompass the Er, A, B, C, D, E, F and G states, respectively. The Vth ranges may be equal in width, in one approach. Read voltages of VrA, VrB, VrC, VrD, VrE, VrF and VrG are used to demarcate between the Er and A states, A and B states, B and C states, C and D states, D and E states, E and F states, and F and G states, respectively. The verify levels during programming are VvA, VvB, VvC, VvD, VvE, VvF and VvG.

Figure 14B:
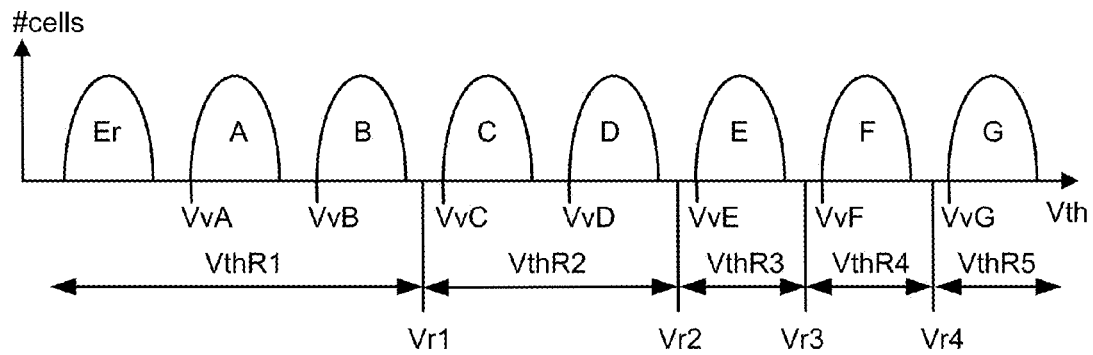
FIG. 14B depicts Vth ranges for unselected memory cell on WLLn+1, with one Vth range for each of the three highest data states (E, F and G), one Vth range for the next two highest data states (C and D), and one Vth range for the lowest three data states (Er, A and B), and eight total data states, as an example of step 532 of FIG. 5C.

FIG. 14B depicts Vth ranges for unselected memory cell on WLLn+1, with one Vth range for each of the three highest data states (E, F and G), one Vth range for the next two highest data states (C and D), and one Vth range for the lowest three data states (Er, A and B), and eight total data states, as an example of step 532 of FIG. 5C. In this example, VthR3, VthR4 and VthR5 encompass the E, F and G states, respectively. VthR2 encompasses the C and D states. VthR1 encompasses the Er, A and B states. The number of voltage ranges is less than in FIG. 14A, and the voltage ranges are of different widths, with the highest voltage range (VthR5) having the smallest width and the lowest voltage range (VthR1) having the largest width. This approach allows the compensation for program disturb to be made with a finer granularity for the higher data states which cause the most program disturb, while reducing the total number of Vth ranges. As a result, the number of read processes and the read time is less than in FIG. 14A. Read voltages of Vr1, Vr2, Vr3 and Vr4 are used to demarcate between VthR1 and VthR2, VthR2 and VthR3, VthR3 and VthR4, and VthR4 and VthR5 respectively.

This is an example of a plurality of threshold voltage ranges comprising a highest threshold voltage range (VthR5) and a lowest threshold voltage range (VthR1), where the highest threshold voltage range encompasses one number of data states (e.g., one state—the G state) of the plurality of data states, and the lowest threshold voltage range encompasses another number of data states (e.g., three states—the A, B and C states) of the plurality of data states. The one number (1) is smaller than the another number (3).

Various other configurations of the Vth ranges are possible. The Vth levels of the memory cells on WLLn+1 are relevant indicators of the amount of program disturb and, in some approaches, the data state need not be determined.

FIG. 15A1 depicts control gate voltages applied to a selected word line, as an example of step 536 of FIG. 5C. In FIGS. 15A, 15B1 and 15C1, the horizontal axis depicts time and the vertical axis depicts the control gate voltage on WLLn. The data states above the voltage levels on the plot indicate the associated control gate voltage is optimal when the memory cell on WLLn+1 is in that data state. As mentioned, a read operation comprises read processes for distinguishing data states, and a read process comprises one or more control gate voltages and corresponding sensing operations. In these examples, the adjustments to the control gate read level are a function of the control gate read level itself as well as the data state or Vth range of the adjacent memory cell.

In FIG. 15A1, a number of the voltages applied to the selected word line and the number of sensing results is the same (i.e., four) for each read process. The sensing results for each selected memory cell are SR1a-SR1d, SR2a-SR2d and SR3a-SR3d for read processes 1, 2 and 3, respectively. In contrast, in FIGS. 15B1 and 15C1, a number of the voltages applied to the selected word line becomes progressively smaller as the read processes distinguish between progressively higher data states.

FIG. 15A2 depicts a table of adjustments to a control gate voltage in a read operation, consistent with FIG. 15A1. The first, second and third rows indicate an increment to be added to the baseline control gate voltage based on the data state of the WLLn+1 memory cell.

The first read process uses a lowest (baseline) voltage of VrA, consistent with FIGS. 6B and 13A, followed by first, second and third elevated voltages. The elevated voltages may increase nonlinearly, as discussed further below, to account for the nonlinear increase in program disturb as a function of data state. For example, the first, second and third elevated control gate voltages may be VrA+0.1 V, VrA+0.2 V and VrA+0.5 V, respectively. Sense results SR1a, SR1b, SR1c and SR1d are obtained during this read process, with one sense result per control gate voltage for each selected memory cell. Furthermore, as discussed, one of the sense results is selected as being optimal for each memory cell based on the data state of the adjacent memory cell on WLLn+1.

The second read process uses a lowest (baseline) voltage of VrB, consistent with FIGS. 6B and 13A, followed by first and second elevated voltages of VrB+0.1 V, VrB+0.2 V, respectively. Sense results SR2a, SR2b, SR2c and SR2d are obtained during the read process. One of the sense results is selected as being optimal for each memory cell. A same control gate voltage may be used when the adjacent memory cell is in the E or A state since essentially no program disturb exists, in one theory. Situations in which the adjacent memory cell is in the B or C state are treated separately since program disturb exists.

The third read process uses a lowest (baseline) voltage of VrC, consistent with FIGS. 6B and 13A, followed a first elevated voltage of Vrc+0.1 V. Sense results SR3a, SR3b, SR3c and SR3d are obtained during the read process. One of the sense results is selected as being optimal for each memory cell. Based on the optimal sense results for each memory cell, the data state of the memory cell can be determined. A same control gate voltage is used when the adjacent memory cell is in the Er, A or B state since essentially no program disturb exists, in one theory.

FIG. 15B1 depicts control gate voltages applied to a selected word line, as an example of step 536 of FIG. 5C. The first, second and third read processes use a set of four (1530), three (1540) or two (1550) control gate voltages, respectively.

FIG. 15B2 depicts a table of adjustments to a control gate voltage in a read operation, consistent with FIG. 15B1. The first, second and third rows indicate an increment to be added to the baseline control gate voltage and are consistent with the sets of control gate voltages 1500, 1510 and 1520, respectively. Within a row, an arrow indicates that the value to the left is used. For example, the first row indicates that increments for VrA are: 0 V, 0.1 V, 0.2 V and 0.5 V when the adjacent memory cell is in the Er, A, B or C state, respectively. In this case, control gate voltages are applied in nine cases in the read operation. A reduction in read time compared to FIG. 15A2 is achieved.

This option reduces the number of sensing operations compared to FIG. 15A1 by grouping data states which have essentially no program disturb effect. For example, the first, second and third read processes group states E and A; Er, A and B; and Er, A, B and C, respectively.

The first read process may use control gate voltages of VrA, VrA+0.1 V, VrA+0.2 V and VrA+0.5 V with associated sense results of SR1a, SR1b, SR1c and SR1d, respectively, which are optimal when the memory cell on WLLn+1 is in the Er, A, B or C state, respectively. The second read process may use control gate voltages of VrB, VrB+0.1 V and VrB+0.2 V, with associated sense results of SR2a, SR2b and SR2c, respectively, which are optimal when the memory cell on WLLn+1 is in the Er/A, B or C state, respectively. The third read process may use control gate voltages of VrC and VrC+0.1 V with associated sense results of SR3a and SR3b which are optimal when the memory cell on WLLn+1 is in the Er/A/B or C state, respectively.

FIG. 15C1 depicts control gate voltages applied to a selected word line, as an example of step 536 of FIG. 5C. The first, second and third read processes use a set of three (1560), two (1570) or one (1580) control gate voltages, respectively.

FIG. 15C2 depicts a table of adjustments to a control gate voltage in a read operation, consistent with FIG. 15C1. The first, second and third rows indicate an increment to be added to the baseline control gate voltage and are consistent with the sets of control gate voltages 1530, 1540 and 1550, respectively. Control gate voltages are applied in six cases in the read operation. A reduction in read time compared to FIG. 15B2 is achieved.

The first read process may use control gate voltages of VrA, VrA+0.2 V and VrA+0.5 V with associated sense results of SR1*a*, SR1*b* and SR1*c*, respectively, which are optimal when the memory cell on WLLn+1 is in the Er/A, B or C state, respectively. The second read process may use control gate voltages of VrB and VrB+0.2 V, with associated sense results of SR2*a* and SR2*b*, respectively, which are optimal when the memory cell on WLLn+1 is in the Er/A/B or C state, respectively. The third read process may use a control gate voltage of VrC with an associated sense result of SR3 which is optimal when the memory cell on WLLn+1 is in the Er/A/B/C state.

Figure 16A:
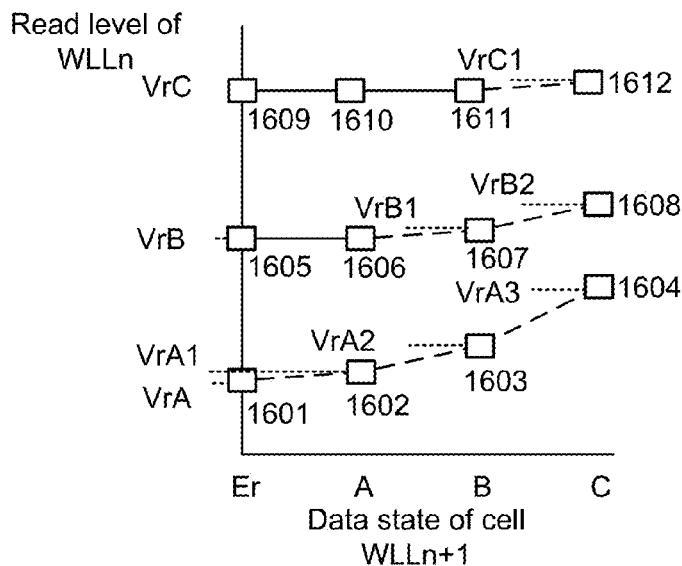
FIG. 16A depicts a plot of control gate voltages which correct for program disturb when reading a memory cell on WLLn as a function of a data state of an adjacent memory cell on WLLn+1 and a read level of the memory cell on WLLn, showing a nonlinear increase in the control gates voltages as a function of the data state, where there are four data states.

FIG. 16A depicts a plot of control gate voltages which correct for program disturb when reading a memory cell on WLLn as a function of a data state of an adjacent memory cell on WLLn+1 and a read level of the memory cell on WLLn, showing a nonlinear increase in the control gates voltages as a function of the data state, where there are four data states. The horizontal axis depicts the data state of a memory cell on WLLn+1 and the vertical axis depicts the control gate voltage (read level) on WLLn. The plots are consistent with FIGS. 13A and 15C1. The data points (denoted by squares) 1601, 1602, 1603 and 1604 represent the control gate voltages VrA, VrA1, VrA2 and VrA3, respectively, which are optimal when the memory cell on WLLn+1 is in the Er, A, B or C state, respectively.

The data points 1605 and 1606 represent the control gate voltage VrB which is optimal when the memory cell on WLLn+1 is in the Er or A state. The data points 1607 and 1608 represent the control gate voltages VrB1 and VrB2, respectively, which are optimal when the memory cell on WLLn+1 is in the B or C state, respectively.

The data points 1609, 1610 and 1611 represent the control gate voltage VrC which is optimal when the memory cell on WLLn+1 is in the Er, A or B state. The data point 1612 represents the control gate voltage VrC1 which is optimal when the memory cell on WLLn+1 is in the C state.

The solid lines between the squares denote no change in the control gate voltage, while the dashed lines between the squares denote a change in the control gate voltage.

In this approach, no compensation for program disturb (e.g., no elevation of the control gate voltage above the lowest level) is provided when the memory cell on WLLn+1 has a data state which is less than the control gate voltage. A data state is less than a control gate voltage when a range of Vth or a median or other representative Vth of the data state is less than a control gate voltage. For example, referring to data point 1606, since the memory cell on WLLn+1 is in the A state, its Vth is less than VrB, so no compensation is applied. Referring to data point 1607, since the memory cell on WLLn+1 is in the B state, its Vth is greater than VrB, so compensation is applied.

VrB1 is an example of one elevated voltage and VrB2 is an example of another elevated voltage which is higher than the one elevated voltage, where an increment between the one elevated voltage and the another elevated voltage is larger than an increment between the one elevated voltage and the lowest voltage (VrB).

It can be said that, among voltages applied to a selected word line (WLLn) during at least one read process of a plurality of read processes, a lowest voltage (e.g., VrA, VrB or VrC) provides the optimal result when the threshold voltage range of the unselected memory cell is below the lowest voltage. At least one elevated voltage (e.g., VrA1, VrA2, VrA3; VrB1, VrB2; or VrC1) provides the optimal result when the threshold voltage range of the unselected memory cell is above the lowest voltage.

Figure 16B:
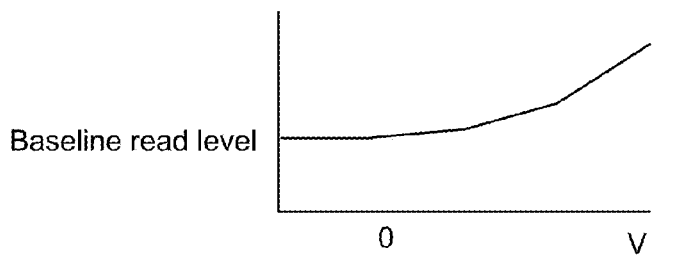
FIG. 16B depicts a plot of a control gate voltage which corrects for program disturb when reading a memory cell on WLLn as a function of a difference between the Vth of the adjacent memory cell on WLLn+1 and the Vth of the memory cell on WLLn.

FIG. 16B depicts a plot of a control gate voltage which corrects for program disturb when reading a memory cell on WLLn as a function of a difference between the Vth of the adjacent memory cell on WLLn+1 and the Vth of the memory cell on WLLn. The horizontal axis depicts an amount by which the Vth of a memory cell on WLLn+1 exceeds the Vth of an adjacent memory cell on WLLn, and the vertical axis depicts a nonlinear increase in the baseline read level which is appropriate to compensate for program disturb. For zero difference, or negative values of the difference, the baseline read level is optimal. For positive values of the difference, an elevated read level is optimal.

Figure 16C:
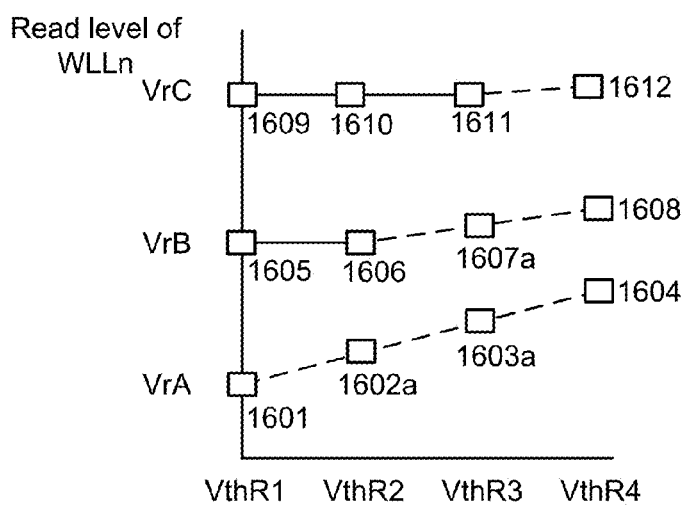
FIG. 16C depicts a plot of control gate voltages which correct for program disturb when reading a memory cell on WLLn as a function of a Vth range an adjacent memory cell on WLLn+1 and a read level of the memory cell on WLLn, showing a linear increase in the control gates voltages as a function of the Vth range, where there are four Vth ranges.

FIG. 16C depicts a plot of control gate voltages which correct for program disturb when reading a memory cell on WLLn as a function of a Vth range an adjacent memory cell on WLLn+1 and a read level of the memory cell on WLLn, showing a linear increase in the control gates voltages as a function of the Vth range, where there are four Vth ranges. The horizontal axis depicts the Vth range of a memory cell on WLLn+1 and the vertical axis depicts the control gate voltage (read level) on WLLn. The plots are consistent with FIG. 13B. The like-numbered data points (denoted by squares) as the same as in FIG. 16A. However, some of the data points are modified to provide a generally linear change in the control gate voltage as a function of the Vth range. For example, data points 1602 and 1603 are increased to 1602*a* and 1603*a*, respectively. Also, data point 1607 is increased to 1607*a*.

Figure 17A:
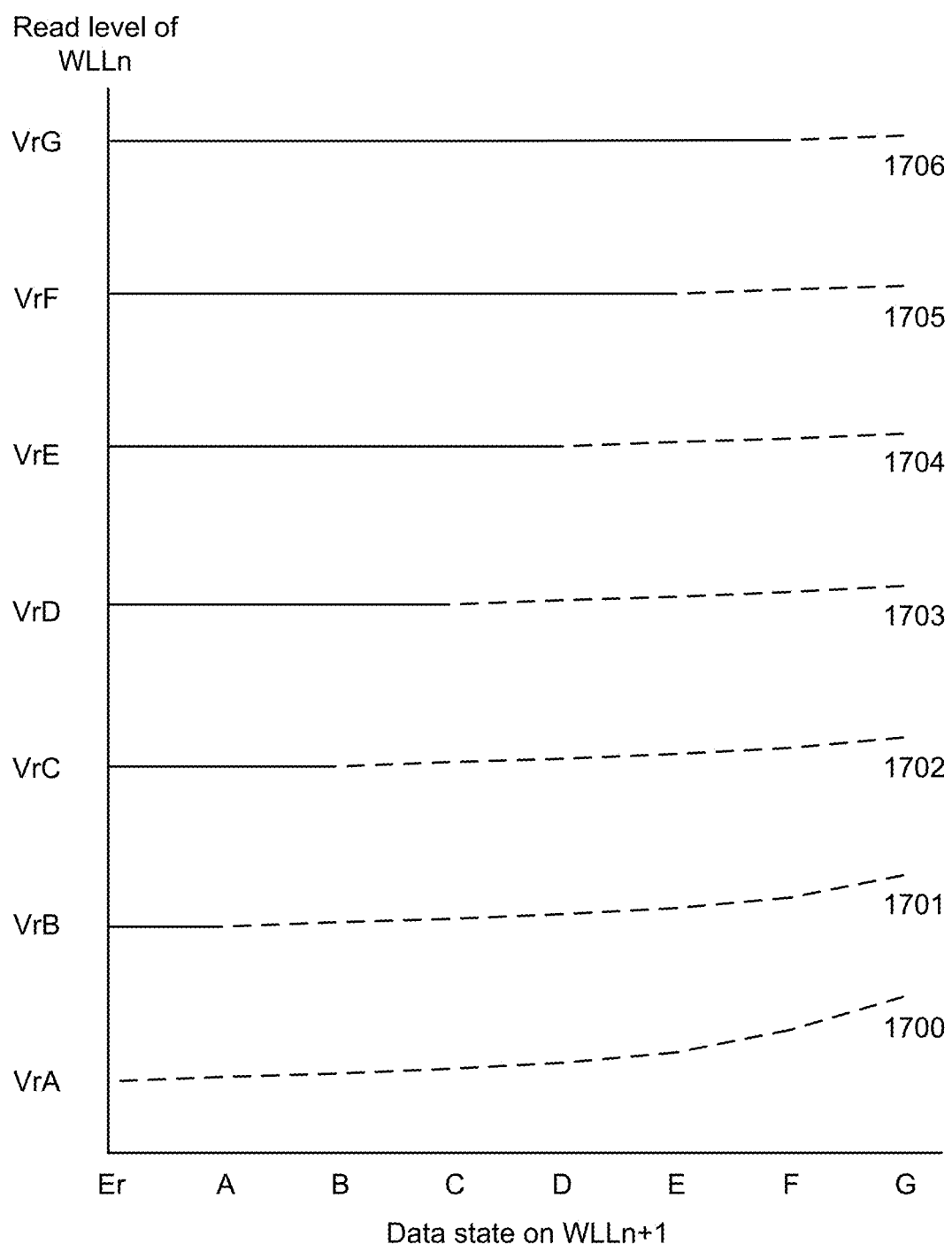
FIG. 17A depicts a plot of control gate voltages which correct for program disturb when reading a memory cell on WLLn as a function of a data state of an adjacent memory cell on WLLn+1 and a read level of the memory cell on WLLn, where there are eight data states.

FIG. 17A depicts a plot of control gate voltages which correct for program disturb when reading a memory cell on WLLn as a function of a data state of an adjacent memory cell on WLLn+1 and a read level of the memory cell on WLLn, where there are eight data states. The horizontal axis depicts the data state on WLLn+1, and the vertical axis depicts a control gate voltage or read level on WLLn. FIG. 17A is consistent with FIG. 14A. The solid lines indicate that compensation for program disturb is not provided, while the dashed lines indicate that compensation is provided. Lines 1700, 1701, 1702, 1703, 1704, 1705 and 1706 represent VrA, VrB, VrC, VrD, VrE, VrF and VrG, respectively, and their associated elevated levels.

Figure 17B:
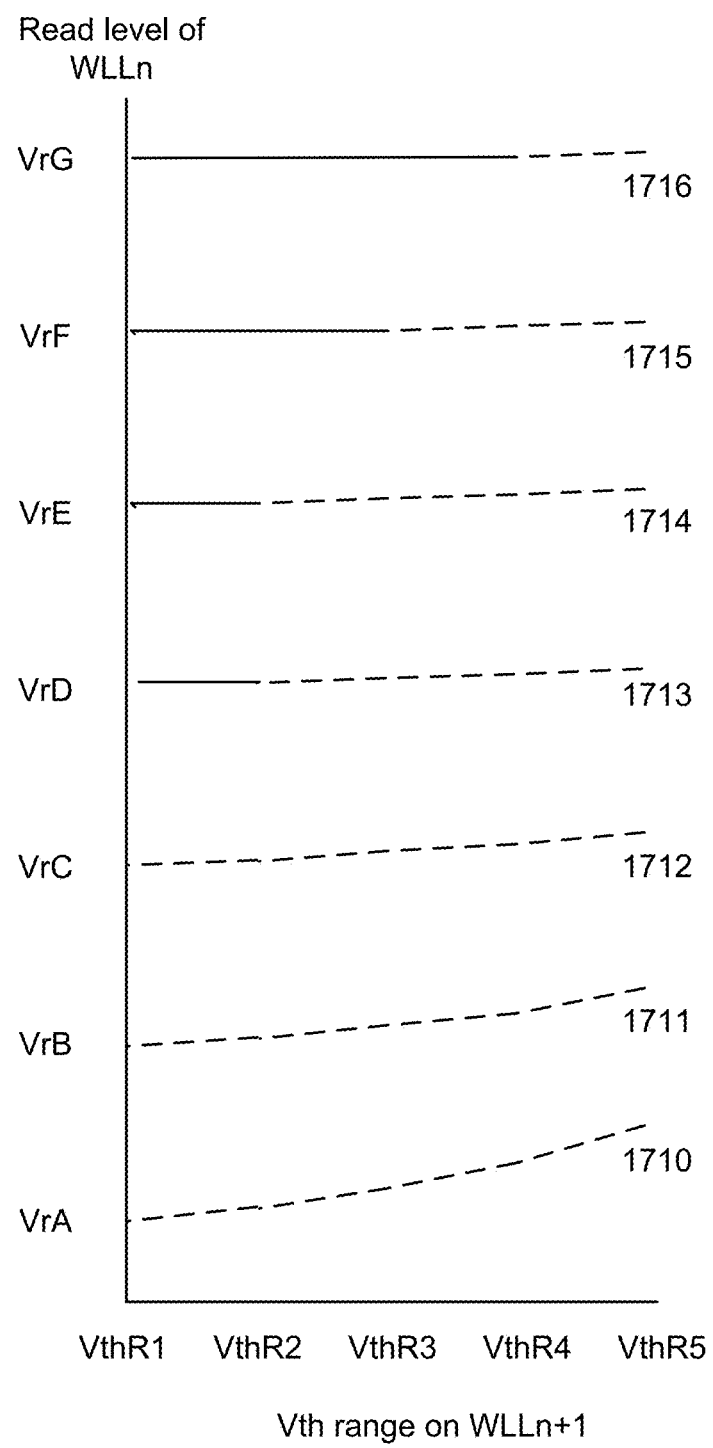
FIG. 17B depicts a plot of control gate voltages which correct for program disturb when reading a memory cell on WLLn as a function of a Vth range an adjacent memory cell on WLLn+1 and a read level of the memory cell on WLLn, where there are five Vth ranges.

FIG. 17B depicts a plot of control gate voltages which correct for program disturb when reading a memory cell on WLLn as a function of a Vth range an adjacent memory cell on WLLn+1 and a read level of the memory cell on WLLn, where there are five Vth ranges. The horizontal axis depicts the Vth range on WLLn+1, and the vertical axis depicts a read level on WLLn. FIG. 17A is consistent with FIG. 14A. The solid lines indicate that compensation for program disturb is not provided, while the dashed lines indicate that compensation is provided. Lines 1710, 1711, 1712, 1713, 1714, 1715 and 1716 represent VrA, VrB, VrC, VrD, VrE, VrF and VrG, respectively, and their associated elevated levels.

Accordingly, it can be seen that, in one embodiment, a method for reading in a memory device comprises: in response to a read command involving a selected memory cell (MC22D) which is connected to a selected word line (WLL22D), reading an unselected memory cell (MC23D) which is connected to an unselected word line (WL23D), the unselected memory cell is adjacent to the selected memory cell, the reading of the unselected memory cell determines a threshold voltage range among a plurality of threshold voltage ranges (VthR1-VthR8) of the unselected memory cell;

and after the reading of the unselected memory cell, performing each read process of a plurality of read processes for the selected memory cell by applying voltages to the selected word line while sensing whether the selected memory cell is in a conductive state and selecting an optimal result from the sensing based on the threshold voltage range of the unselected memory cell, wherein the read processes distinguish between data states among a plurality of data states, and among voltages applied to the selected word line during at least one read process of the plurality of read processes a lowest voltage (VrA, VrB or VrC) provides the optimal result when the threshold voltage range of the unselected memory cell is below the lowest voltage and at least one elevated voltage (VrA1, VrA2, VrA3; VrB1, VrB2; or VrC1) provides the optimal result when the threshold voltage range of the unselected memory cell is above the lowest voltage.

In another embodiment, a memory device comprises: a selected word line (WLL22D) connected to a selected memory cell (MC22D); an unselected word line (WLL23D) connected to an unselected memory cell (MC23D), the unselected memory cell is adjacent to the selected memory cell; and a control circuit (110, 112, 114, 116, 122, 128, 130, 132). The control circuit: in response to a read command involving the selected memory cell, read the unselected memory cell to determine a threshold voltage range among a plurality of threshold voltage ranges (VthR1-VthR8) of the unselected memory cell; and after the read of the unselected memory cell, to perform each read process of a plurality of read processes for the selected memory cell, apply voltages to the selected word line while sensing whether the selected memory cell is in a conductive state and selecting an optimal result from the sensing based on the threshold voltage range of the unselected memory cell, wherein the read processes distinguish between data states among a plurality of data states, and among voltages applied to the selected word line during at least one read process of the plurality of read processes a lowest voltage (VrA, VrB or VrC) provides the optimal result when the threshold voltage range of the unselected memory cell is below the lowest voltage and at least one elevated voltage (VrA1, VrA2, VrA3; VrB1, VrB2; or VrC1) provides the optimal result when the threshold voltage range of the unselected memory cell is above the lowest voltage.

In another embodiment, a method for reading in a memory device comprises: in response to a read command involving a selected memory cell which is connected to a selected word line, reading an unselected memory cell which is connected to an unselected word line, the unselected memory cell is adjacent to the selected memory cell, the reading of the unselected memory cell determines a threshold voltage range of the unselected memory cell; and after the reading of the unselected memory cell, reading the selected memory cell, the reading of the selected memory cell provides compensation for program disturb of the selected memory cell by the unselected memory cell, and the compensation is a function of a differences between the threshold voltage range of the unselected memory cell and control gate voltages applied to the selected memory cell during the reading of the selected memory cell.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for reading in a memory device, comprising:
in response to a read command involving a selected memory cell which is connected to a selected word line, reading an unselected memory cell which is connected to an unselected word line, the unselected memory cell is adjacent to the selected memory cell, the reading of the unselected memory cell determines a threshold voltage range among a plurality of threshold voltage ranges of the unselected memory cell; and
after the reading of the unselected memory cell, performing each read process of a plurality of read processes for the selected memory cell by applying voltages to the selected word line while sensing whether the selected memory cell is in a conductive state and selecting an optimal result from the sensing based on the threshold voltage range of the unselected memory cell, wherein:
the read processes distinguish between data states among a plurality of data states;
among voltages applied to the selected word line during at least one read process of the plurality of read processes, a lowest voltage provides the optimal result when the threshold voltage range of the unselected memory cell is below the lowest voltage and at least one elevated voltage provides the optimal result when the threshold voltage range of the unselected memory cell is above the lowest voltage; and
over the plurality of read processes, a number of the voltages applied to the selected word line becomes progressively smaller as the plurality of read processes distinguish between progressively higher data states among the plurality of data states.

2. The method of claim 1, wherein:
the at least one elevated voltage comprises one elevated voltage and another elevated voltage which is higher than the one elevated voltage; and
an increment between the one elevated voltage and the another elevated voltage is larger than an increment between the one elevated voltage and the lowest voltage.

3. The method of claim 1, wherein:
the voltages applied to the selected word line during the plurality of read processes provide compensation for program disturb of the selected memory cell by the unselected memory cell; and
the compensation is nonlinearly proportional to an amount by which the threshold voltage range of the unselected memory cell is above the lowest voltage.

4. The method of claim 1, wherein:
the threshold voltage range of the unselected memory cell encompasses one data state of the plurality of data states.

5. The method of claim 1, wherein:
the threshold voltage range of the unselected memory cell encompasses multiple data states of the plurality of data states.

6. The method of claim 1, wherein:
the threshold voltage range of the unselected memory cell encompasses a highest portion of a highest data state of the plurality of data states; and
a next lower threshold voltage range of the plurality of threshold voltage ranges which is adjacent to the threshold voltage range of the unselected memory cell encompasses a next highest portion of the highest data state.

7. The method of claim 1, wherein:
the plurality of threshold voltage ranges comprise a highest threshold voltage range and a lowest threshold voltage range, the highest threshold voltage range is smaller than the lowest threshold voltage range.

8. The method of claim 7, wherein:
the highest threshold voltage range encompasses a highest data state of the plurality of data states and the lowest threshold voltage range encompasses a lowest data state of the plurality of data state.

9. The method of claim 1, wherein:
the plurality of threshold voltage ranges comprise a highest threshold voltage range and a lowest threshold voltage range;
the highest threshold voltage range encompasses one number of data states of the plurality of data states;
the lowest threshold voltage range encompasses another number of data states of the plurality of data states; and
the one number is smaller than the another number.

10. A memory device, comprising:
a selected word line connected to a selected memory cell;
an unselected word line connected to an unselected memory cell, the unselected memory cell is adjacent to the selected memory cell; and
a control circuit, the control circuit configured to:
   in response to a read command involving the selected memory cell, read the unselected memory cell to determine a threshold voltage range among a plurality of threshold voltage ranges of the unselected memory cell; and
after the read of the unselected memory cell, to perform each read process of a plurality of read processes for the selected memory cell, apply voltages to the selected word line while sensing whether the selected memory cell is in a conductive state and select an optimal result from the sensing based on the threshold voltage range of the unselected memory cell, wherein:
   the read processes distinguish between data states among a plurality of data states;
   among voltages applied to the selected word line during at least one read process of the plurality of read processes, a lowest voltage provides the optimal result when the threshold voltage range of the unselected memory cell is below the lowest voltage and at least one elevated voltage provides the optimal result when the threshold voltage range of the unselected memory cell is above the lowest voltage; and
   the threshold voltage range of the unselected memory cell encompasses multiple data states of the plurality of data states.

11. The memory device of claim 10, wherein:
the selected memory cell and the unselected memory cell are in a NAND string in a three-dimensional structure;
the unselected word line is on a drain side of the selected word line; and
sensing circuitry which performs the plurality of read processes for the selected memory cells is connected to a drain side of the selected memory cell.

12. The memory device of claim 10, wherein:
the selected memory cell and the unselected memory cell are in a three-dimensional stacked memory structure comprising alternating conductive layers and dielectric layers;
the selected memory cell is connected to one of the conductive layers; and
the unselected memory cell is connected to another of the conductive layers.

13. The memory device of claim 10, wherein:
the selected memory cell and the unselected memory cell are arranged along a continuous memory film in a three-dimensional structure.

14. The memory device of claim 10, wherein:
the threshold voltage range of the unselected memory cell encompasses a highest portion of a highest data state of the plurality of data states; and
a next lower threshold voltage range of the plurality of threshold voltage ranges which is adjacent to the threshold voltage range of the unselected memory cell encompasses a next highest portion of the highest data state.

15. A method for reading in a memory device, comprising:
in response to a read command involving a selected memory cell which is connected to a selected word line, reading an unselected memory cell which is connected to an unselected word line, the unselected memory cell is adjacent to the selected memory cell, the reading of the unselected memory cell determines a threshold voltage range of the unselected memory cell; and
after the reading of the unselected memory cell, reading the selected memory cell, the reading of the selected memory cell provides compensation for program disturb of the selected memory cell by the unselected memory cell, the compensation is a function of a differences between the threshold voltage range of the unselected memory cell and control gate voltages applied to the selected memory cell during the reading of the selected memory cell, and the threshold voltage range of the unselected memory cell encompasses multiple data states.

16. The method of claim 15, wherein:
the compensation is nonlinearly proportional to the differences.

17. The method of claim 15, wherein:
the threshold voltage range of the unselected memory cell is defined with a granularity of less than one data state.

* * * * *